(12) United States Patent
Ueda et al.

(10) Patent No.: US 11,901,431 B2
(45) Date of Patent: Feb. 13, 2024

(54) COATING LIQUID FOR FORMING METAL OXIDE FILM, OXIDE INSULATOR FILM, FIELD-EFFECT TRANSISTOR, DISPLAY ELEMENT, IMAGE DISPLAY DEVICE, AND SYSTEM

(71) Applicant: Ricoh Company, Ltd., Tokyo (JP)

(72) Inventors: Naoyuki Ueda, Kanagawa (JP); Yuki Nakamura, Tokyo (JP); Yukiko Abe, Kanagawa (JP); Shinji Matsumoto, Kanagawa (JP); Yuji Sone, Kanagawa (JP); Ryoichi Saotome, Kanagawa (JP); Sadanori Arae, Kanagawa (JP); Minehide Kusayanagi, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 399 days.

(21) Appl. No.: 17/262,515

(22) PCT Filed: Jul. 19, 2019

(86) PCT No.: PCT/JP2019/028566
§ 371 (c)(1),
(2) Date: Jan. 22, 2021

(87) PCT Pub. No.: WO2020/022233
PCT Pub. Date: Jan. 30, 2020

(65) Prior Publication Data
US 2021/0305394 A1 Sep. 30, 2021

(30) Foreign Application Priority Data
Jul. 23, 2018 (JP) ................................ 2018-137403

(51) Int. Cl.
*H01L 21/02* (2006.01)
*H01L 27/12* (2006.01)
(Continued)

(52) U.S. Cl.
CPC .... *H01L 29/4908* (2013.01); *H01L 21/02565* (2013.01); *H01L 21/445* (2013.01);
(Continued)

(58) Field of Classification Search
CPC ............. H01L 21/02565; H01L 21/445; H01L 21/28518; H01L 21/823431;
(Continued)

(56) References Cited

U.S. PATENT DOCUMENTS 9,748,097 B2 * 8/2017 Nakamura .............. H01L 29/24
9,806,202 B2 * 10/2017 Yamazaki ......... H01L 29/66818
(Continued)

FOREIGN PATENT DOCUMENTS

EP     3 118 900 A1    1/2017
JP     2007-19432 A    1/2007
(Continued)

OTHER PUBLICATIONS

Office Action dated Dec. 20, 2022 in Japanese Patent Application No. 2018-137403, 2 pages.
(Continued)

*Primary Examiner* — Nikolay K Yushin
(74) *Attorney, Agent, or Firm* — XSENSUS LLP

(57) ABSTRACT

A field-effect transistor including: a source electrode and a drain electrode; a gate electrode; a semiconductor layer; and a gate insulating layer, wherein the gate insulating layer is an oxide insulator film including A element and B element, the A element being one or more selected from the group consisting of Zr and Hf and the B element being one or more selected from the group consisting of Be and Mg.

15 Claims, 10 Drawing Sheets

(51) Int. Cl.
*H01L 29/49* (2006.01)
*H01L 21/445* (2006.01)
*H01L 29/66* (2006.01)
*H01L 29/786* (2006.01)
*G02F 1/1368* (2006.01)
*H10K 59/121* (2023.01)

(52) U.S. Cl.
CPC .... *H01L 27/1225* (2013.01); *H01L 29/66969* (2013.01); *H01L 29/7869* (2013.01); *G02F 1/1368* (2013.01); *H10K 59/1213* (2023.02)

(58) Field of Classification Search
CPC ............. H01L 27/1225; H01L 27/1248; H01L 27/124; H01L 27/0924; H01L 29/4908; H01L 29/66969; H01L 29/7869; H10K 59/1213; H10K 59/12; H10K 59/01; G02F 1/1368; G02F 1/1303; G02F 1/134309
See application file for complete search history.

(56) References Cited

U.S. PATENT DOCUMENTS

| | | | |
|---|---|---|---|
| 9,972,274 B2 | 5/2018 | Saotome et al. | |
| 10,008,181 B2 | 6/2018 | Saotome et al. | |
| 10,020,374 B2 | 7/2018 | Sone et al. | |
| 10,170,635 B2* | 1/2019 | Matsumoto | H01L 29/41733 |
| 10,270,430 B2* | 4/2019 | Guo | H03K 3/02332 |
| 10,278,430 B2* | 5/2019 | Cyphert | A24F 1/28 |
| 10,784,120 B2* | 9/2020 | Inoue | H01L 29/7869 |
| 2010/0059834 A1 | 3/2010 | Dubourdieu et al. | |
| 2010/0090204 A1 | 4/2010 | Chuman et al. | |
| 2011/0089927 A1 | 4/2011 | Yamazaki et al. | |
| 2016/0042947 A1* | 2/2016 | Nakamura | H01L 21/02628 257/43 |
| 2016/0149055 A1* | 5/2016 | Yamazaki | H10B 12/30 257/43 |
| 2017/0018650 A1 | 1/2017 | Saotome et al. | |
| 2017/0162172 A1 | 6/2017 | Saotome et al. | |
| 2017/0162704 A1 | 6/2017 | Abe et al. | |
| 2017/0170333 A1* | 6/2017 | Matsumoto | H01L 29/7869 |
| 2017/0271381 A1 | 9/2017 | Sone et al. | |
| 2018/0183414 A1* | 6/2018 | Guo | H03K 23/58 |
| 2018/0226046 A1 | 8/2018 | Saotome et al. | |
| 2018/0277060 A1 | 9/2018 | Saotome et al. | |
| 2018/0331196 A1 | 11/2018 | Sone et al. | |
| 2019/0027508 A1 | 1/2019 | Ueda et al. | |
| 2019/0027608 A1 | 1/2019 | Matsumoto et al. | |
| 2019/0088501 A1* | 3/2019 | Inoue | H01L 21/02288 |
| 2019/0164480 A1 | 5/2019 | Saotome et al. | |
| 2019/0172390 A1 | 6/2019 | Saotome et al. | |
| 2019/0280098 A1 | 9/2019 | Ueda et al. | |
| 2020/0075768 A1 | 3/2020 | Ueda et al. | |
| 2020/0083383 A1 | 3/2020 | Sone et al. | |

FOREIGN PATENT DOCUMENTS

| | | |
|---|---|---|
| JP | 2010-62499 A | 3/2010 |
| JP | 2010-525596 A | 7/2010 |
| JP | 2011-151370 A | 8/2011 |
| JP | 2011-171700 A | 9/2011 |
| JP | 2011-216845 A | 10/2011 |
| JP | 2016-146495 A | 8/2016 |
| JP | 2018-056592 A | 4/2018 |
| JP | 2018-098222 A | 6/2018 |
| JP | 2018-160670 A | 10/2018 |
| TW | 201703259 A | 1/2017 |
| WO | WO 2008/117395 A1 | 10/2008 |
| WO | WO 2017/0159702 A1 | 9/2017 |
| WO | WO 2018/101278 A1 | 6/2018 |

OTHER PUBLICATIONS

Thin-Film Transistors, Cherie R. Kagan (editing), Paul Andry (editing) publisher: CRC Press (Feb. 25, 2003).
International Search Report dated Oct. 9, 2019 for counterpart International Patent Application No. PCT/JP2019/028566 filed Jul. 19, 2019.
Written Opinion dated Oct. 9, 2019 for counterpart International Patent Application No. PCT/JP2019/028566 filed Jul. 19, 2019.
Taiwanese Office Action dated Feb. 11, 2020 (dated Feb. 13, 2020) for corresponding Taiwanese Application No. 108125873.
Taiwanese Office Action dated Nov. 12, 2020 (dated Nov. 13, 2020) for corresponding Taiwanese Application No. 108125873.
Office Action dated Aug. 22, 2022 in Korean Patent Application No. 10-2021-7004922, 22 pages.
Korean Office Action dated Mar. 30, 2022, in corresponding Korean Application No. 10-2021-7004922, 15 pp.

* cited by examiner

[Fig. 1]
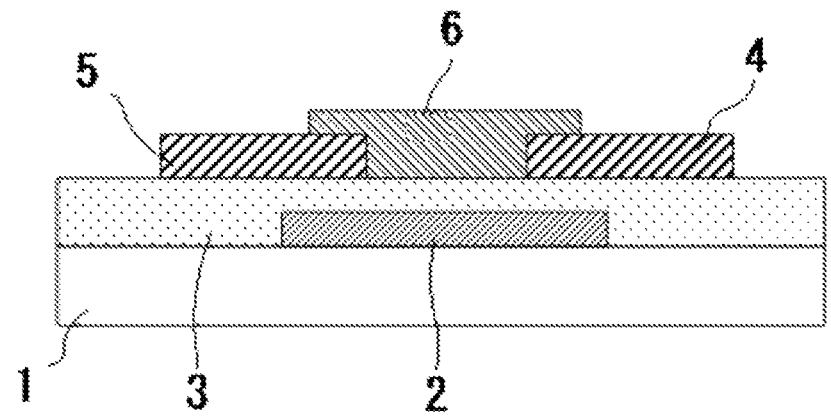
[Fig. 2]
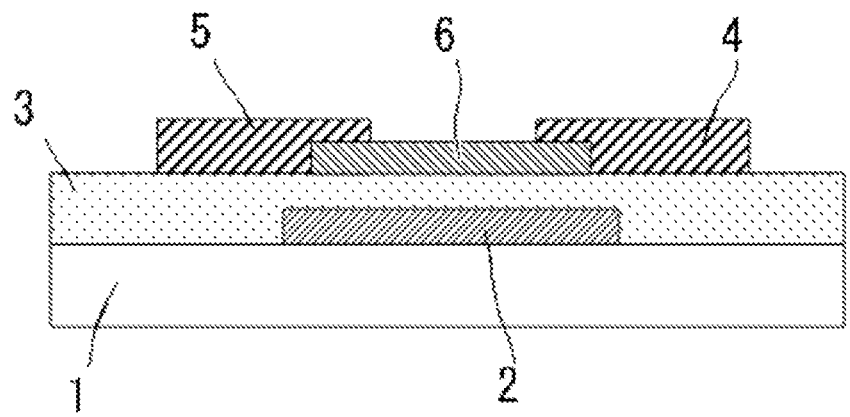
[Fig. 3]
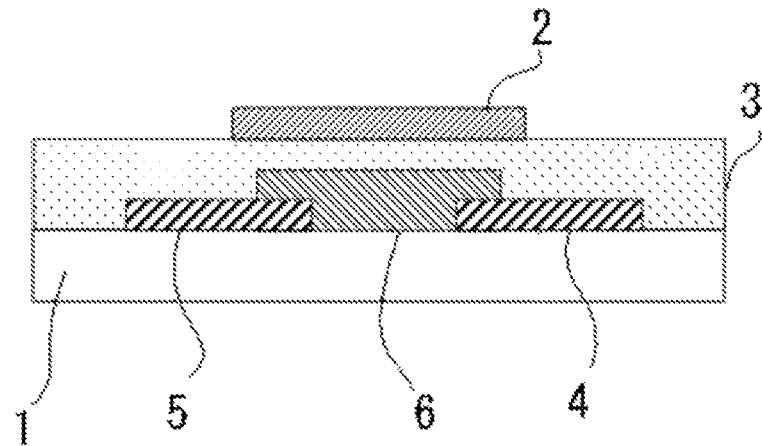

[Fig. 4]
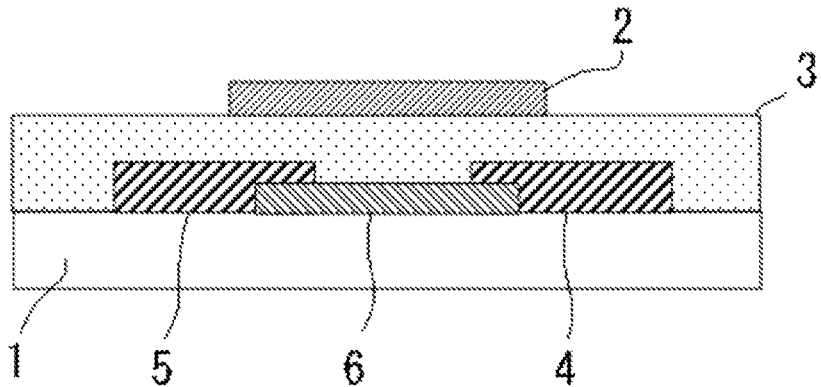
[Fig. 5]
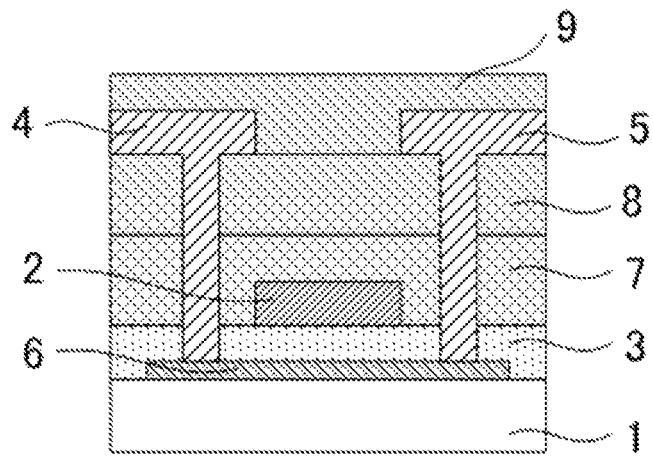
[Fig. 6A]
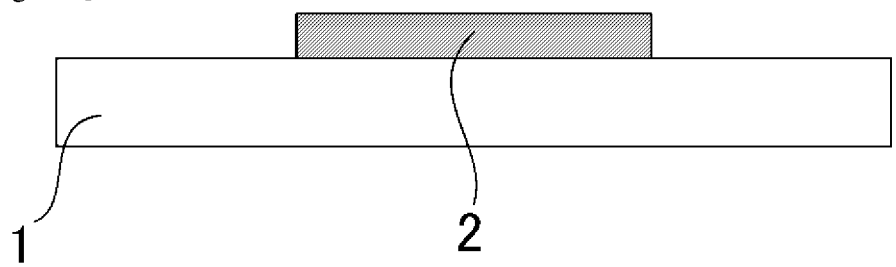
[Fig. 6B]
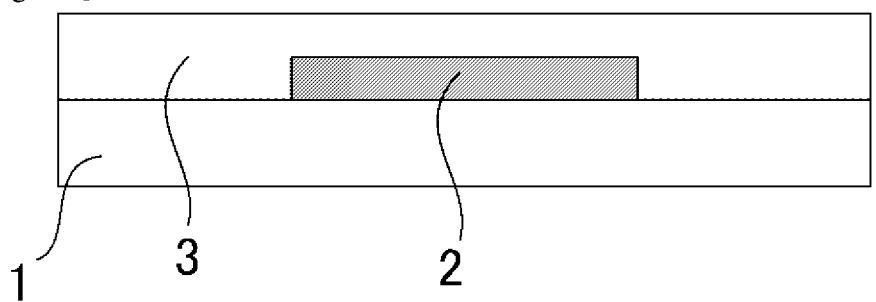

[Fig. 6C]
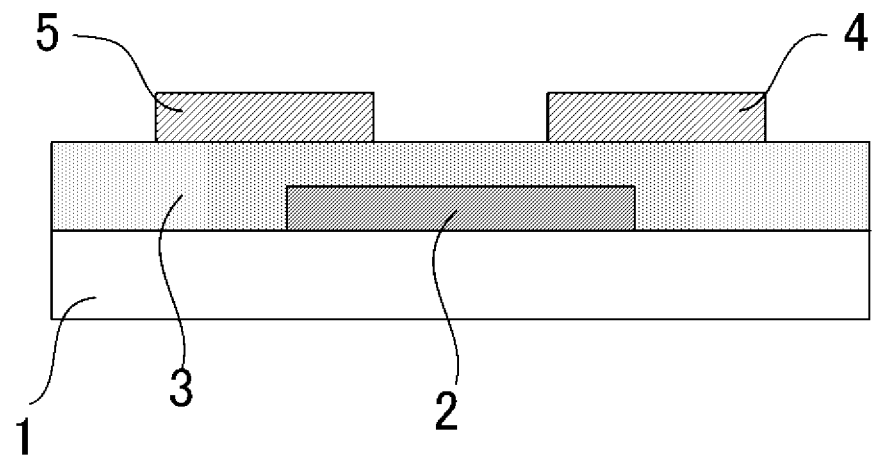
[Fig. 6D]
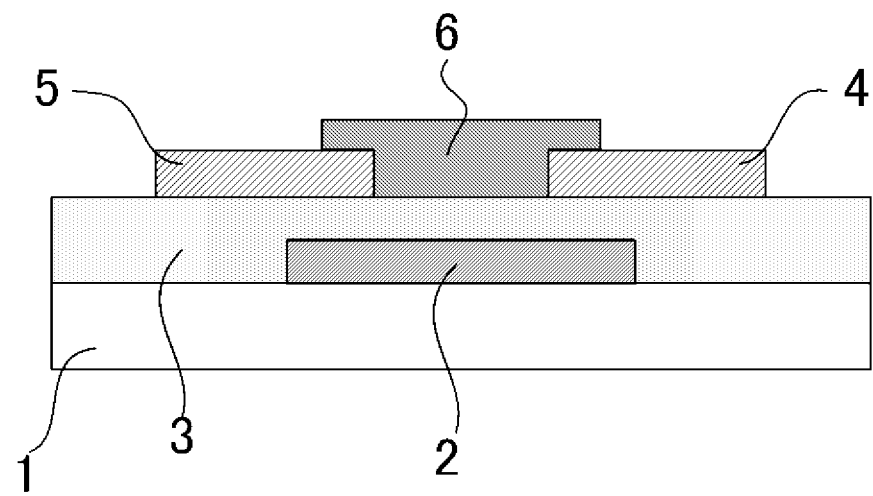

[Fig. 7]
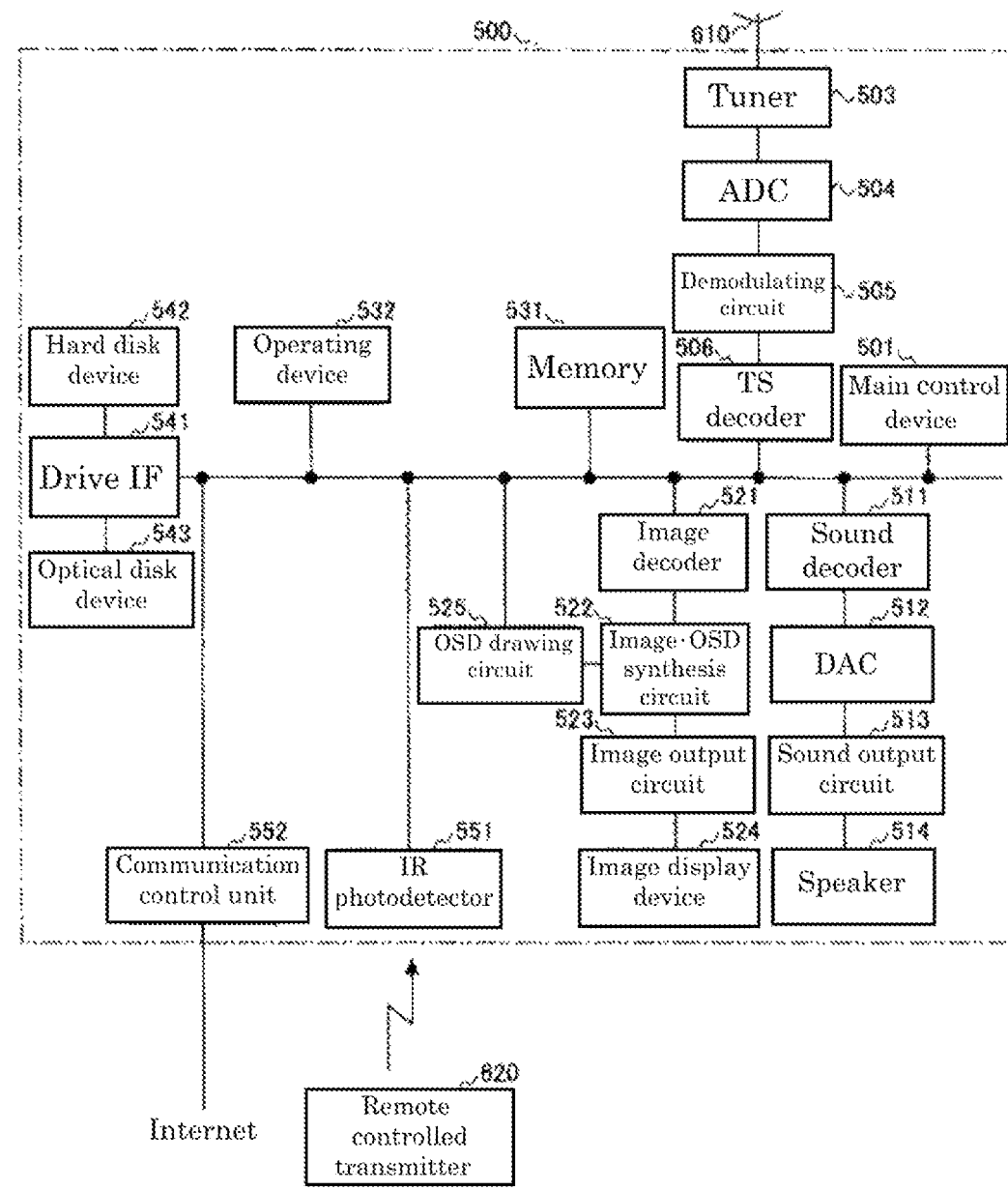

[Fig. 8]
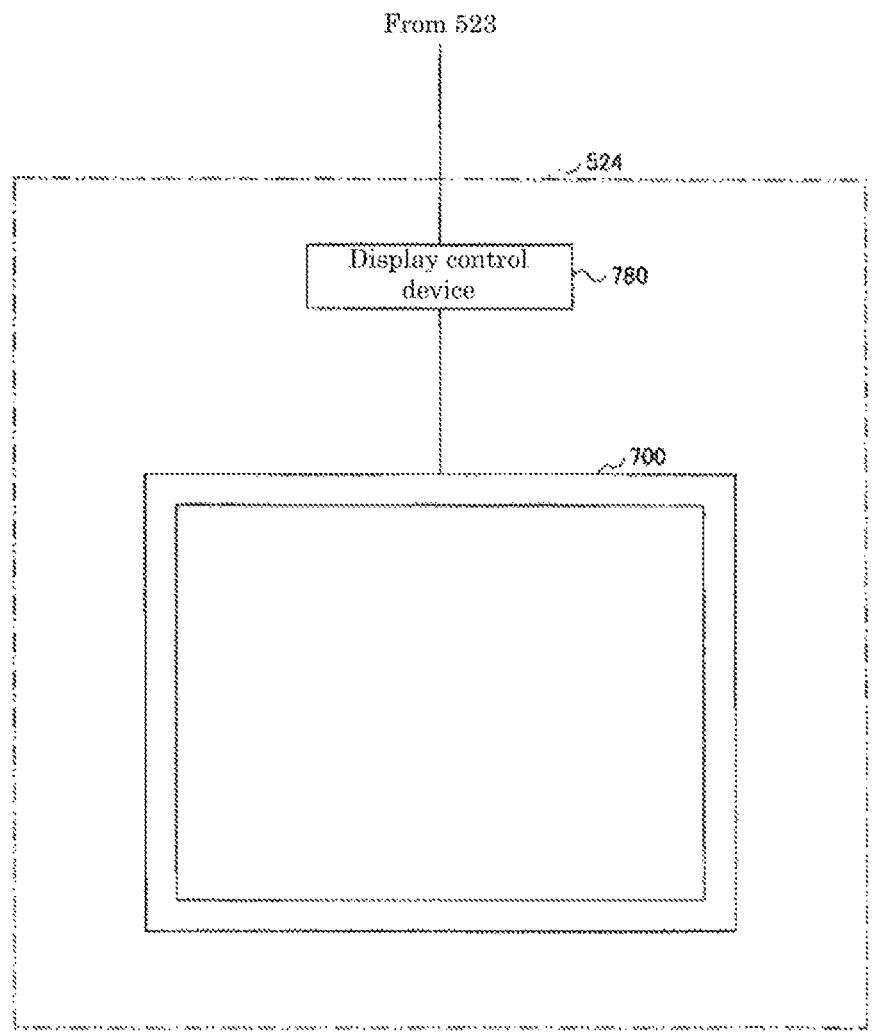

[Fig. 9]
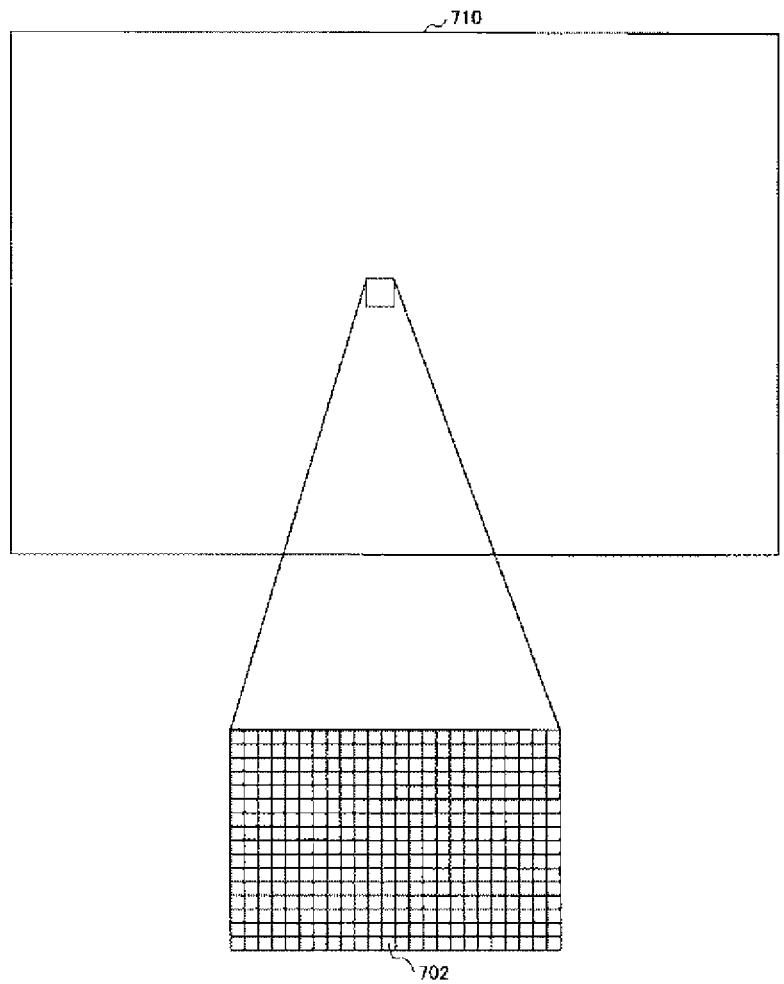

[Fig. 10]
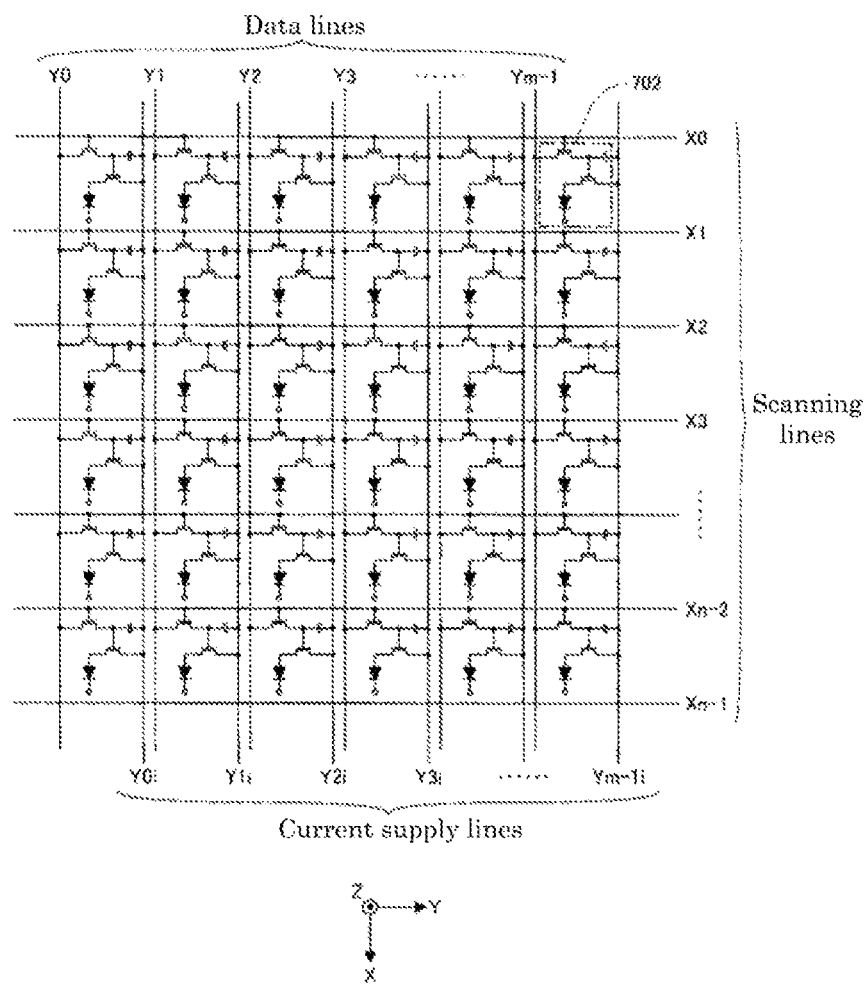

[Fig. 11]
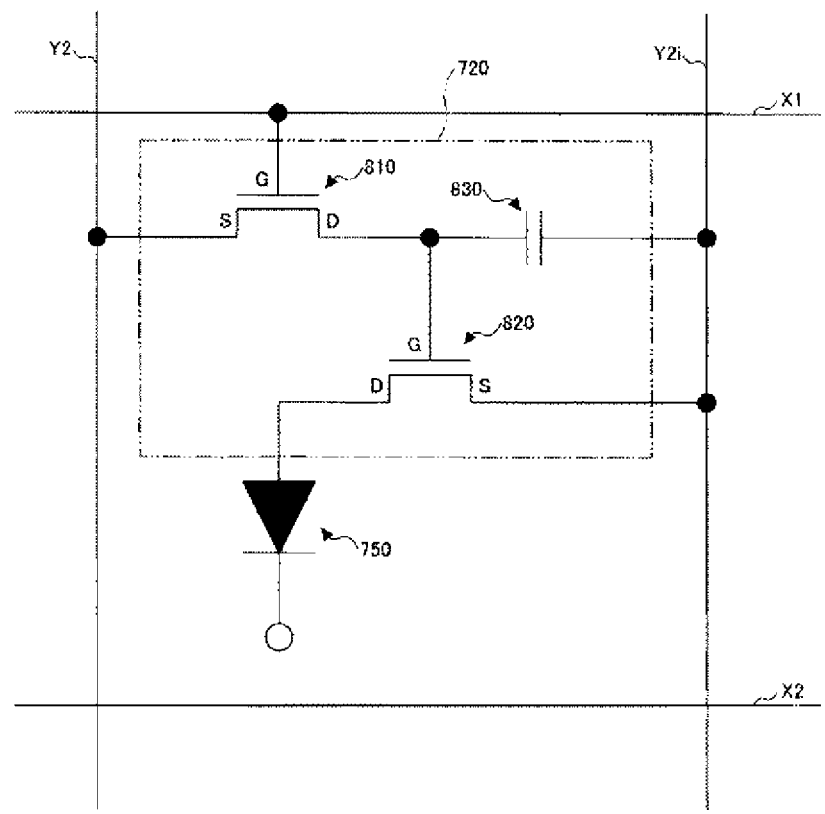
[Fig. 12]
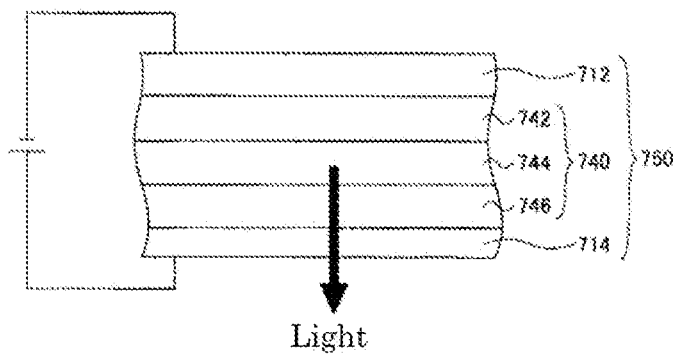
Light

[Fig. 13]
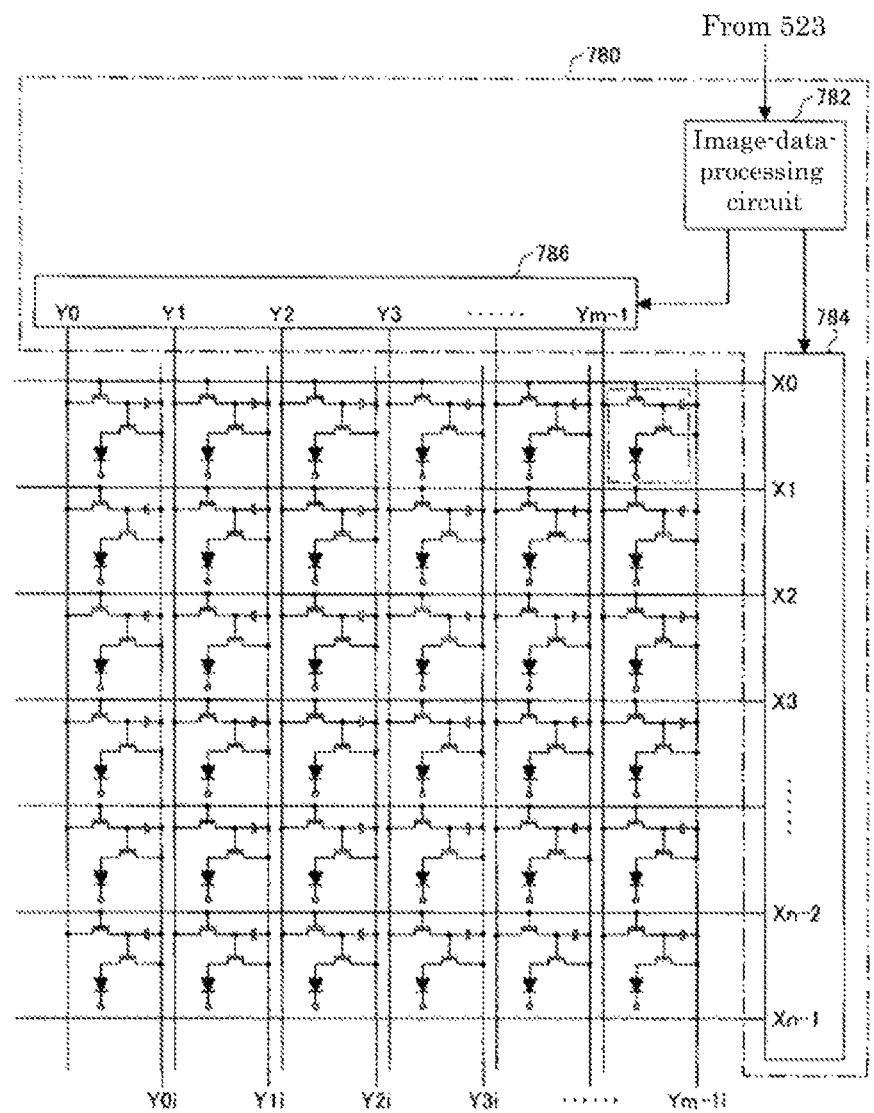

[Fig. 14]
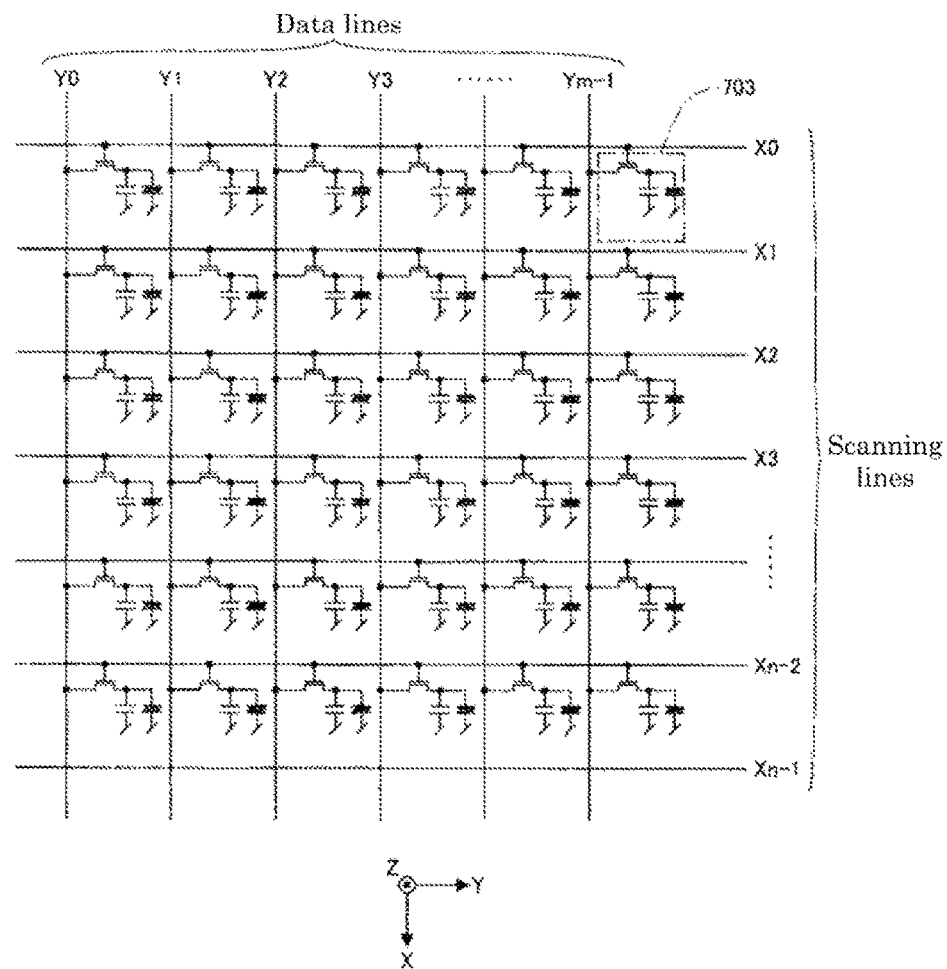
[Fig. 15]
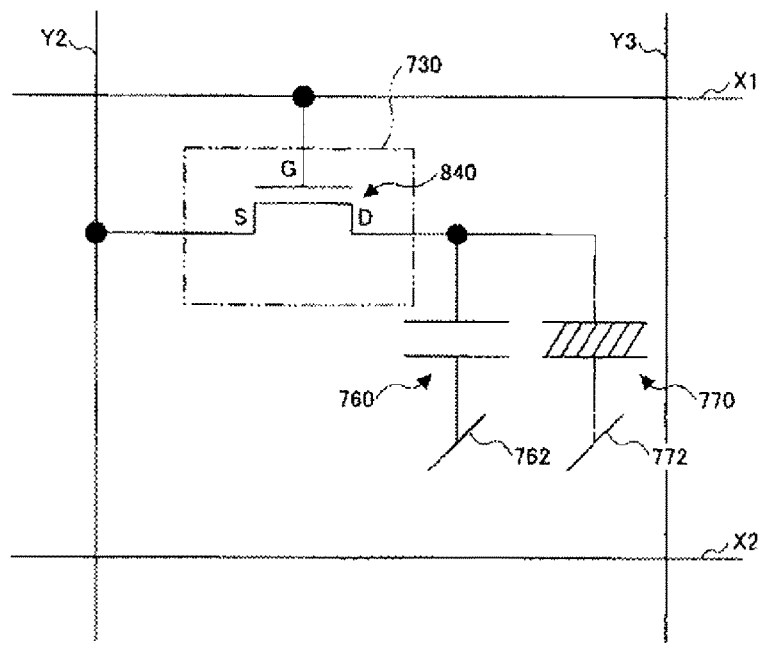

COATING LIQUID FOR FORMING METAL OXIDE FILM, OXIDE INSULATOR FILM, FIELD-EFFECT TRANSISTOR, DISPLAY ELEMENT, IMAGE DISPLAY DEVICE, AND SYSTEM

TECHNICAL FIELD

The present disclosure relates to a coating liquid for forming a metal oxide film, an oxide insulator film, a field-effect transistor, a display element, an image display device, a system, a method for producing the oxide insulator film, and a method for producing the field-effect transistor.

BACKGROUND ART

In recent years, among flat panel displays, a liquid crystal display (LCD) or an organic EL display having an active matrix thin film transistor (AM-TFT) as a backplane has been the mainstream. The semiconductors used for the TFTs are roughly divided into the following three types: amorphous silicon (a-Si), low-temperature polysilicon (LTPS), and In—Ga—Zn—O (IGZO)-based oxide semiconductors. Among them, oxide semiconductor TFTs (hereinafter, referred to as oxide TFTs) have been highly expected and have been researched and developed around the world (see, for example, NPL 1).

Meanwhile, a gate insulating film is a key part constituting the TFT. Industrially, a film of $SiO_2$ or SiON formed through the chemical vapor deposition (CVD) has been consistently used from an earlier time. Industrially, a film of $SiO_2$ or SiON formed through the chemical vapor deposition (CVD) has been used as the gate insulating film in all of the three types of TFTs.

In recent years, as larger screen displays, higher resolution, and finer pixel sizes are developed, it is increasingly necessary to improve mobility of semiconductors and a relative dielectric constant of the gate insulating film.

Therefore, there is a demand for providing a field-effect transistor using an oxide insulator film having a high dielectric constant.

Typical methods for forming semiconductor layers and gate insulating layers are, for example, the sputtering method, the chemical vapor deposition (CVD), and the atomic layer deposition (ALD).

However, there are problems that these vacuum processes require complex and expensive apparatuses and safety measures with respect to source gases, and process cost is high. In addition, limitation on the source gasses makes it difficult to freely control formulation and physical characteristics of the oxide film.

In recent years, interest has focused on the liquid-phase method that is easily performed and enables cost reduction. In the liquid-phase method, a large area of a metal oxide film can be easily produced at a low process temperature.

Therefore, even in a field-effect transistor using an oxide insulator film having a high dielectric constant, there is a demand for providing a large area of a field-effect transistor using an oxide insulator film having a high dielectric constant that can be easily produced at a low process temperature.

CITATION LIST

Non Patent Literature

NPL 1: Thin-Film Transistors, Cherie R. Kagan (editing), Paul Andry (editing) publisher: CRC Press (2003 Feb. 25)

SUMMARY OF INVENTION

Technical Problem

An object of the present disclosure is to provide a field-effect transistor, which includes an oxide insulator film having a high dielectric constant as a gate insulating layer and has high performances.

Solution to Problem

Means for solving the aforementioned problems are as follows.

That is, a field-effect transistor of the present disclosure includes: a source electrode and a drain electrode; a gate electrode; a semiconductor layer; and a gate insulating layer. The gate insulating layer is an oxide insulator film including A element and B element, the A element being one or more selected from the group consisting of Zr and Hf and the B element being one or more selected from the group consisting of Be and Mg.

Advantageous Effects of Invention

According to the present disclosure, it is possible to provide a field-effect transistor, which includes an oxide insulator film having a high dielectric constant as a gate insulating layer and has high performances.

BRIEF DESCRIPTION OF DRAWINGS

FIG. 1 is a schematic structural view illustrating one example of a bottom gate/bottom contact field-effect transistor.

FIG. 2 is a schematic structural view illustrating one example of a bottom gate/top contact field-effect transistor.

FIG. 3 is a schematic structural view illustrating one example of a top gate/bottom contact field-effect transistor.

FIG. 4 is a schematic structural view illustrating one example of a top gate/top contact field-effect transistor.

FIG. 5 is a schematic structural view illustrating one example of a top gate/ILD field-effect transistor.

FIG. 6A is a view illustrating one example of a method for producing a field-effect transistor of the present disclosure (part 1).

FIG. 6B is a view illustrating one example of a method for producing a field-effect transistor of the present disclosure (part 2).

FIG. 6C is a view illustrating one example of a method for producing a field-effect transistor of the present disclosure (part 3).

FIG. 6D is a view illustrating one example of a method for producing a field-effect transistor of the present disclosure (part 4).

FIG. 7 is a block diagram of configuration of a television device in another embodiment.

FIG. 8 is an explanatory diagram (1) of a television device in another embodiment.

FIG. 9 is an explanatory diagram (2) of a television device in another embodiment.

FIG. 10 is an explanatory diagram (3) of a television device in another embodiment.

FIG. 11 is an explanatory diagram of a display element in another embodiment.

FIG. 12 is an explanatory view of an organic EL in another embodiment.

FIG. 13 is an explanatory diagram (4) of a television device in another embodiment.

FIG. 14 is an explanatory diagram (1) of another display element in another embodiment.

FIG. 15 is an explanatory diagram (2) of another display element in another embodiment.

DESCRIPTION OF EMBODIMENTS (Coating Liquid for Forming Metal Oxide Film)

A coating liquid of the present disclosure for forming a metal oxide film includes at least A element and B element, preferably includes C element, and further includes other components such as a solvent if necessary.

The coating liquid for forming a metal oxide film includes, for example, at least a metal source, and further includes other components such as a solvent if necessary. The metal source includes at least an A element-including compound including the A element and a B element-including compound including the B element, preferably includes a C element-including compound including the C element, and further include other components if necessary.

The coating liquid for forming a metal oxide film is a coating liquid for forming a metal oxide film that can easily form a large area of an oxide insulator film having a high dielectric constant at a low process temperature.

The coating liquid for forming a metal oxide film can be suitably used for producing an oxide insulator film of the present disclosure that will be described hereinafter.

<A Element>

The A element is one or more selected from the group consisting of Zr (zirconium) and Hf (hafnium).

<B Element>

The B element is one or more selected from the group consisting of Be (beryllium) and Mg (magnesium).

<C Element>

The C element is one or more selected from the group consisting of Sc (scandium), Y (yttrium), and Ln (lanthanoid).

Examples of the Ln (lanthanoid) include La (lanthanum), Ce (cerium), Pr (praseodymium), Nd (neodymium), Sm (samarium), Eu (europium), Gd (gadolinium), Tb (terbium), Dy (dysprosium), Ho (holmium), Er (erbium), Tm (thulium), Yb (ytterbium), and Lu (lutetium).

<<Solvent>>

The solvent is not particularly limited and may be appropriately selected depending on the intended purpose. Preferable examples thereof include organic solvents and water.

<<<Organic Solvent>>>

The organic solvent is not particularly limited and may be appropriately selected depending on the intended purpose. The organic solvent is preferably at least one selected from the group consisting of organic acids, organic acid esters, aromatic compounds, diols, glycol ethers, polar aprotic solvents, alkane compounds, alkene compounds, ether compounds, and alcohols.

—Organic Acid Ester—

The organic acid is not particularly limited and may be appropriately selected depending on the intended purpose. Preferable examples thereof include acetic acid, lactic acid, propionic acid, octylic acid, neodecanoic acid, and derivatives thereof.

These may be used alone or in combination.

—Organic Acid Ester—

The organic acid ester is not particularly limited and may be appropriately selected depending on the intended purpose. Preferable examples thereof include ethyl acetate, propyl acetate, methyl lactate, propyl propionate, and derivatives thereof.

These may be used alone or in combination.

—Aromatic Compound—

The aromatic compound is not particularly limited and may be appropriately selected depending on the intended purpose. Preferable examples thereof include toluene, xylene, mesitylene, tetralin, cyclohexylbenzene, and derivatives thereof.

These may be used alone or in combination.

—Diol—

The diol is not particularly limited and may be appropriately selected depending on the intended purpose, and is preferably alkanediol and dialkylene glycol. The diol preferably includes from 2 through 6 carbon atoms. The diol is more preferably at least one selected from the group consisting of diethylene glycol, 1,2-ethanediol, 1,2-propanediol, and 1,3-butanediol.

These may be used alone or in combination.

—Glycol Ether—

The glycol ether is not particularly limited and may be appropriately selected depending on the intended purpose, and is preferably alkylene glycol monoalkyl ether. The glycol ether preferably includes from 3 through 8 carbon atoms.

The alkylene glycol monoalkyl ether is preferably at least one selected from the group consisting of ethylene glycol monomethyl ether, ethylene glycol monoethyl ether, ethylene glycol monopropyl ether, ethylene glycol monobutyl ether, propylene glycol-1-monomethyl ether, and propylene glycol-1-monobutyl ether. These alkylene glycol monoalkyl ethers have a boiling point of from about 120 degrees Celsius through about 180 degrees Celsius, which makes it possible to bake the coating liquid at relatively low temperature for a short time. Also, after the baking, the oxide film with less impurities such as carbon and organic matters can be obtained.

These may be used alone or in combination.

—Polar Aprotic Solvent—

The polar aprotic solvent favorably dissolves the metal source and exhibits high stability after the dissolution. Therefore, when the polar aprotic solvent is used for the coating liquid for forming a metal oxide film, a metal oxide film having high homogeneity and little deficiency can be obtained.

The polar aprotic solvent is not particularly limited and may be appropriately selected depending on the intended purpose. Preferable examples thereof include isophorone, propylene carbonate, tetrahydrofuran, dihydrofuran-2(3H)-one, dimethylformamide, dimethylacetamide, 1,3-dimethyl-2-imidazolidinone, and derivatives thereof.

These may be used alone or in combination.

—Alkane Compound—

The alkane compound is not particularly limited and may be appropriately selected depending on the intended purpose. For example, n-hexane, cyclohexane, n-nonane, tetradecane, decaline, and derivatives thereof are preferable.

These may be used alone or in combination.

—Alkene Compound—

The alkene compound is not particularly limited and may be appropriately selected depending on the intended purpose. For example, 1-dodecene, 1-tetradecene, and derivatives thereof are preferable.

These may be used alone or in combination.

—Ether Compound—

The ether compound is not particularly limited and may be appropriately selected depending on the intended purpose. For example, tetrahydrofuran, polyethylene glycol, and derivatives thereof are preferable.

These may be used alone or in combination.

—Alcohol—

The alcohol is not particularly limited and may be appropriately selected depending on the intended purpose. For examples, methanol, ethanol, isopropyl alcohol, t-butanol, and derivatives thereof are preferable.

These may be used alone or in combination.

The coating liquid for forming a metal oxide film is obtained by, for example, dissolving the metal source as a solute in the solvent.

<Metal Source>

The metal source is at least one selected from the group consisting of inorganic salts, oxides, hydroxides, metal complexes, and organic acid salts.

Examples of the inorganic salts include nitrates, sulfates, chlorides, carbonates, acetates, and phosphates. These may be used alone or in combination.

Examples of the organic acid salts include carboxylates, phenols, and derivatives thereof. These may be used alone or in combination.

Examples of the carboxylates include aliphatic carboxylates, aromatic carboxylates, hydroxy carboxylates, dicarboxylates, tricarboxylates, and oxocarboxylates. These may be used alone or in combination.

The metal source as the solute may be dissociated to be ions so long as it is uniformly dissolved in the solvent. In this case, segregation of the concentration is difficult to occur in the coating liquid for forming a metal oxide film, which makes it possible to use the coating liquid for forming a metal oxide film for a long period of time. In addition, a thin film produced by using this coating liquid has a homogeneous formulation. Therefore, characteristic uniformity is also favorable when it is used in, for example, the gate insulating layer and the semiconductor layer of TFTs.

Hereinafter, the metal sources will be described one by one for each metal type.

<<A Element-Including Compound>>

Examples of the A element-including compound include zirconium-including compounds and hafnium-including compounds.

—Zirconium-Including Compound—

The zirconium-including compound is not particularly limited and may be appropriately selected depending on the intended purpose. Examples of the zirconium-including compound include zirconium oxynitrate dihydrate, anhydrous zirconium chloride, zirconium chloride hydrate, zirconium oxysulfate, zirconium acetate tetrahydrate, zirconium oxide, zirconium hydroxide, zirconium acetylacetonate, and zirconium 2-ethylhexanoate.

These zirconium-including compounds may be a synthesized product or a commercially available product.

—Hafnium-Including Compound—

The hafnium-including compound is not particularly limited and may be appropriately selected depending on the intended purpose. Examples of the hafnium-including compound include hafnium nitrate anhydride, anhydrous hafnium chloride, hafnium chloride tetrahydrofuran complex, hafnium sulfate, hafnium acetate, hafnium oxide, hafnium hydroxide, hafnium acetylacetonate, and hafnium 2-ethylhexanoate.

These hafnium-including compounds may be a synthesized product or a commercially available product.

<<B Element-Including Compound>>

Examples of the B element-including compound include beryllium-including compounds and magnesium-including compounds.

—Beryllium-Including Compound—

The beryllium-including compound is not particularly limited and may be appropriately selected depending on the intended purpose. Examples of the beryllium-including compound include beryllium nitrate trihydrate, beryllium chloride tetrahydrate, beryllium sulfate tetrahydrate, beryllium acetate, beryllium oxide, beryllium hydroxide, beryllium fluoride, basic beryllium carbonate, beryllium acetylacetonate, and basic beryllium propionate.

These beryllium-including compounds may be a synthesized product or a commercially available product.

—Magnesium-Including Compound—

The magnesium-including compound is not particularly limited and may be appropriately selected depending on the intended purpose. Examples of the magnesium-including compound include magnesium nitrate hexahydrate, magnesium chloride hexahydrate, magnesium acetate tetrahydrate, magnesium oxide, magnesium hydroxide, magnesium acetylacetonate, magnesium propionate, magnesium 2-ethylhexanoate, magnesium benzoate tetrahydrate, magnesium lactate trihydrate, magnesium 2-ethylbutyrate, magnesium salicylate tetrahydrate, trimagnesium dicitrate nonahydrate, and magnesium diphenolate.

These magnesium-including compounds may be a synthesized product or a commercially available product.

<<C Element-Including Compound>>

Examples of the C element-including compound include scandium-including compounds, yttrium-including compounds, and lanthanoid-including compounds.

—Scandium-Including Compound—

The scandium-including compound may be appropriately selected depending on the intended purpose. Examples of the scandium-including compound include scandium nitrate pentahydrate, scandium chloride hexahydrate, scandium acetate hydrate, scandium oxide, scandium hydroxide, scandium acetylacetonate, and scandium 2-ethylhexanoate.

These scandium-including compounds may be a synthesized product or a commercially available product.

—Yttrium-Including Compound—

The yttrium-including compound may be appropriately selected depending on the intended purpose. Examples of the yttrium-including compound include yttrium nitrate hexahydrate, yttrium chloride hexahydrate, yttrium acetate tetrahydrate, yttrium oxide, yttrium hydroxide, yttrium acetylacetonate, and yttrium 2-ethylhexanoate.

These yttrium-including compounds may be a synthesized product or a commercially available product.

—Lanthanoid-Including Compound—

A lanthanum-including compound, a cerium-including compound, and a lutetium-including compound as typical examples of the lanthanoid-including compound will be described below.

—Lanthanum-Including Compound—

Lanthanum (La) is one example of lanthanoid (Ln).

The lanthanum-including compound is not particularly limited and may be appropriately selected depending on the intended purpose. Examples of the lanthanum-including compound include lanthanum nitrate hexahydrate, lanthanum chloride heptahydrate, lanthanum phosphate hydrate, lanthanum acetate hydrate, lanthanum oxide, lanthanum hydroxide, lanthanum acetylacetonate, and lanthanum 2-ethylhexanoate.

These lanthanum-including compounds may be a synthesized product or a commercially available product.

—Cerium-Including Compound—

Cerium (Ce) is one example of lanthanoid (Ln).

The cerium-including compound is not particularly limited and may be appropriately selected depending on the intended purpose. Examples of the cerium-including compound include cerium nitrate hexahydrate, cerium chloride heptahydrate, cerium acetate monohydrate, cerium oxide, cerium hydroxide, cerium acetylacetonate, and cerium 2-ethylhexanoate.

These cerium-including compounds may be a synthesized product or a commercially available product.

—Lutetium-Including Compound—

Lutetium (Lu) is one example of lanthanoid (Ln).

The lutetium-including compound is not particularly limited and may be appropriately selected depending on the intended purpose. Examples of the lutetium-including compound include lutetium nitrate hexahydrate, lutetium chloride hexahydrate, lutetium acetate tetrahydrate, lutetium oxide, lutetium hydroxide, lutetium acetylacetonate, and lutetium 2-ethylhexanoate.

These lutetium-including compounds may be a synthesized product or a commercially available product.

The same description is applicable to other lanthanoids such as Pr (praseodymium) and Gd (gadolinium).

<Method for Preparing Coating Liquid for Forming Metal Oxide Film>

A method for preparing the coating liquid for forming a metal oxide film is not particularly limited and may be appropriately selected depending on the intended purpose. One specific example of the method is as follows. Specifically, a metal salt diol solution and a metal salt glycol ether solution are each prepared. Then, the metal salt diol solution and the metal salt glycol ether solution are mixed at a desired ratio.

The coating liquid of the present disclosure for forming a metal oxide film is suitable for a coating liquid for preparing a metal oxide film. Particularly, the coating liquid of the present disclosure is suitable for coating liquids for preparing a gate insulating layer and an interlayer dielectric of a field-effect transistor.

Note that, in the present disclosure, the metal oxide may include nitrogen. That is, the metal oxide may be a so-called oxynitride.

(Oxide Insulator Film)

An oxide insulator film of the present invention includes at least A element and B element, preferably includes C element, and further includes other components if necessary.

The oxide insulator film is an insulating oxide.

The oxide includes oxynitride.

<A Element>

The A element is one or more selected from the group consisting of Zr (zirconium) and Hf (hafnium).

<B Element>

The B element is one or more selected from the group consisting of Be (beryllium) and Mg (magnesium).

<C Element>

The C element is one or more selected from the group consisting of Sc (scandium), Y (yttrium), and Ln (lanthanoid).

Examples of the Ln (lanthanoid) include La (lanthanum), Ce (cerium), Pr (praseodymium), Nd (neodymium), Sm (samarium), Eu (europium), Gd (gadolinium), Tb (terbium), Dy (dysprosium), Ho (holmium), Er (erbium), Tm (thulium), Yb (ytterbium), and Lu (lutetium).

An electron configuration of d orbital of a metal ion included in the oxide insulator film is preferably $d^0$ or $d^{10}$. The d orbital where the electron configuration is $d^0$ or $d^{10}$ is the closed-shell structure. Therefore, there is no absorption in the visible light region, presenting a wide band gap energy.

(Method for Producing Oxide Insulator Film)

A method of the present disclosure for producing an oxide insulator film includes coating the coating liquid of the present disclosure for forming a metal oxide film on an object to be coated, and drying the coating liquid, followed by baking, and further includes other steps if necessary.

The object to be coated is not particularly limited and may be appropriately selected depending on the intended purpose. Examples of the object to be coated include glass substrates and plastic substrates.

When the oxide insulator film is used in the gate insulating layer and an interlayer dielectric of the field-effect transistor, the object to be coated is, for example, a substrate, a gate electrode, and a semiconductor layer. A shape, a structure, and a size of the substrate are not particularly limited and may be appropriately selected depending on the intended purpose. A material of the substrate is not particularly limited and may be appropriately selected depending on the intended purpose. Examples thereof include glass and plastic.

A method of the coating is not particularly limited and may be appropriately selected depending on the intended purpose. Examples of the method include the screen printing method, the roll coating method, the dip-coating method, the spin coating method, the die coating method, the inkjet method, and the nanoimprint method. Among them, the spin coating method and the die coating method are preferable because these methods are easily combined with the existing photolithography techniques.

The drying is not particularly limited and may be appropriately selected depending on the intended purpose, so long as volatile components in the coating liquid for forming a metal oxide film can be removed. Note that, in the drying, it is not necessary to completely remove the volatile components, and the volatile components can be removed in such a degree that the volatile components do not inhibit the baking.

A temperature of the baking is not particularly limited and may be appropriately selected depending on the intended purpose, so long as the temperature is equal to or higher than a temperature at which the metal elements included in the coating liquid form oxides, and the temperature is equal to or lower than a temperature at which the substrate (object to be coated) is deformed by heat. The temperature of the baking is preferably from 150 degrees Celsius through 600 degrees Celsius.

An atmosphere of the baking is not particularly limited and may be appropriately selected depending on the intended purpose. For example, an oxygen-including atmosphere (e.g., in oxygen and in the air) is preferable. The above atmospheres can oxidize and gasify organic matters and anions included in the metal sources or the solvents to be removed from the film. Moreover, when the coating liquid is baked in an atmosphere including nitrogen (e.g., in nitrogen and in an ammonia vapor), it is possible to incorporate nitrogen into the film to form the oxynitride film. As a result, the physical characteristics of the film such as relative dielectric constant and thermal expansion coefficient can be controlled.

Time for the baking is not particularly limited and may be appropriately selected depending on the intended purpose.

An average thickness of the oxide insulator film formed is not particularly limited and may be appropriately selected depending on the intended purpose. For example, as the gate insulating layer, the average thickness thereof is preferably from 1 nm through 500 nm, more preferably from 10 nm through 300 nm, particularly preferably from 50 nm through 200 nm.

(Field-Effect Transistor)

A field-effect transistor of the present disclosure includes at least a source electrode and a drain electrode, a gate electrode, a semiconductor layer, and a gate insulating layer, and further includes other components such as a substrate if necessary.

<Gate Electrode>

The gate electrode is not particularly limited and may be appropriately selected depending on the intended purpose, so long as the gate electrode is, for example, an electrode to which gate voltage is to be applied.

A material of the gate electrode is not particularly limited and may be appropriately selected depending on the intended purpose. Examples of the material include metals (e.g., platinum, palladium, gold, silver, copper, zinc, aluminium, nickel, chromium, tantalum, molybdenum, tungsten, and titanium), alloys of these metals, mixtures of these metals, and stacked films thereof. Moreover, examples of the material include conductive oxides (e.g., indium oxide, zinc oxide, tin oxide, gallium oxide, and niobium oxide), composite compounds thereof, mixtures thereof, and stacked films thereof.

An average thickness of the gate electrode is not particularly limited and may be appropriately selected depending on the intended purpose, and is preferably from 40 nm through 2 micrometers, more preferably from 70 nm through 1 micrometer.

<Source Electrode and Drain Electrode>

The source electrode and the drain electrode are not particularly limited and may be appropriately selected depending on the intended purpose.

A material of the source electrode and a material of the drain electrode are not particularly limited and may be appropriately selected depending on the intended purpose. Examples thereof include the same materials as the materials exemplified in the description of the gate electrode.

An average thickness of the source electrode and the drain electrode is not particularly limited and may be appropriately selected depending on the intended purpose, and is preferably from 40 nm through 2 micrometers, more preferably from 70 nm through 1 micrometer.

<Semiconductor Layer>

The semiconductor layer (active layer) is, for example, a semiconductor layer where channel is formed between the source electrode and the drain electrode.

A material of the semiconductor layer is not particularly limited and may be appropriately selected depending on the intended purpose. Examples thereof include polycrystalline silicon (p-Si), amorphous silicon (a-Si), an oxide semiconductor, and an organic semiconductor such as pentacene. Among them, the oxide semiconductor is preferable in terms of stability of interface between the semiconductor layer and the gate insulating layer.

The semiconductor layer can be formed by, for example, an n-type oxide semiconductor.

The n-type oxide semiconductor constituting the semiconductor layer is not particularly limited and may be appropriately selected depending on the intended purpose. The n-type oxide semiconductor preferably includes: at least one selected from the group consisting of indium (In), zinc (Zn), tin (Sn), and titanium (Ti); and an alkaline earth element or a rare earth element, more preferably includes In and an alkaline earth element or a rare earth element.

Examples of the rare earth element include scandium (Sc), yttrium (Y), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

An average thickness of the semiconductor layer is not particularly limited and may be appropriately selected depending on the intended purpose. The average thickness thereof is preferably from 1 nm through 200 nm, more preferably from 5 nm through 100 nm.

<Gate Insulating Layer>

The gate insulating layer is an oxide insulator film.

The oxide insulator film is the oxide insulator film of the present disclosure. That is, the oxide insulator film includes at least A element and B element, preferably includes C element, and further includes other components if necessary.

The gate insulating layer of the field-effect transistor preferably has characteristics such as a high dielectric constant, a high insulating property, and high chemical durability. In addition, in order to achieve the high insulating property, a film that has a wide band gap energy and is amorphous is preferable.

Conventionally, as the high-k gate insulating film in the CMOS field, many crystalline oxides represented as perovskite oxides including Zr, Hf, or Ln have been considered (e.g., $Gd_2O_3$, $Pr_2O_3$, $LaAlO_3$, $La_2O_3$, $ZrO_2$, $HfO_2$, $SrZrO_3$, $CaHfO_3$, $LaScO_3$, and $La_2Zr_2O_7$) (Non Patent Literature: ISRN Nanotechnology, Vol. 2012, (2012) 35).

It is reported that these insulating films have a considerably high relative dielectric constant value of from about 10 through about 40. However, these insulating films have not been put into practical use.

In order to inhibit gate leakage, grain boundary existing in the polycrystalline film is disadvantageous, and a highly amorphous oxide is preferable. From this viewpoint, in the (Ca, Sr, Ba)O—(Zr, Hf)$O_2$ system, there are a perovskite crystal phase and a layered perovskite crystal phase having various formulations, and crystals are easily precipitated at a relatively low temperature.

Meanwhile, in the (Be, Mg)O—(Zr, Hf)$O_2$-system of the oxide insulator film that is the oxide insulator film of the present disclosure, there is neither a perovskite phase nor a layered perovskite phase, and thus an amorphous film is easily maintained. Moreover, a band gap energy becomes large, resulting in an excellent insulating property.

Here, rare earth oxides ($RE_2O_3$) and (Zr, Hf) oxides each have a high heat resistance and melting points thereof are more than 2,000 degrees Celsius. However, in the $RE_2O_3$—(Zr, Hf)$O_2$-system, there is a pyrochlore crystal phase represented as $La_2Zr_2O_7$, and a crystal phase is generated at a relatively low temperature (e.g., 650 degrees Celsius for $La_2Zr_2O_7$).

However, a three-component system of (Be, Mg)O-$RE_2O_3$—(Zr, Hf)$O_2$, which is a preferable aspect of the oxide insulator film of the present disclosure, can increase an amorphous property, can expand a band gap energy, and can improve a chemical durability, which makes it possible to provide an excellent oxide insulator film.

Moreover, an electron configuration of d orbital of a metal ion included in the oxide insulator film of the present disclosure is preferably $d^0$ or $d^{10}$. The d orbital where the electron configuration is $d^0$ or $d^{10}$ is the closed-shell structure. Therefore, there is no absorption in the visible light region, presenting a wide band gap energy.

An average thickness of the gate insulating layer is not particularly limited and may be appropriately selected depending on the intended purpose. The average thickness thereof is preferably from 10 nm through 1 micrometer, more preferably from 30 nm through 300 nm.

<Substrate>

A shape, a structure, and a size of the substrate are not particularly limited and may be appropriately selected depending on the intended purpose.

The substrate is not particularly limited and may be appropriately selected depending on the intended purpose. Examples of the substrate include glass substrates and plastic substrates.

A material of the glass substrate is not particularly limited and may be appropriately selected depending on the intended purpose. Examples of the material include alkali-free glass and silica glass.

A material of the plastic substrate is not particularly limited and may be appropriately selected depending on the intended purpose. Examples of the material include polycarbonate (PC), polyimide (PI), polyethylene terephthalate (PET), and polyethylene naphthalate (PEN).

Note that, the substrate is preferably subjected to a pre-treatment (e.g., oxygen plasma, UV-ozone, and cleaning through UV irradiation) in order to clean the surface and to improve close adhesiveness.

A structure of the field-effect transistor is not particularly limited and may be appropriately selected depending on the intended purpose. Examples of the structure include a bottom gate/bottom contact field-effect transistor (FIG. 1), a bottom gate/top contact field-effect transistor (FIG. 2), a top gate/bottom contact field-effect transistor (FIG. 3), a top gate/top contact field-effect transistor (FIG. 4), and a TG-ILD (top gate-interlayer dielectric) structure (FIG. 5).

In FIG. 1 to FIG. 5, the reference numeral 1 denotes a substrate, the reference numeral 2 denotes a gate electrode, the reference numeral 3 denotes a gate insulating layer, the reference numeral 4 denotes a source electrode, the reference numeral 5 denotes a drain electrode, the reference numeral 6 denotes a semiconductor layer, the reference numeral 7 denotes a first interlayer dielectric, the reference numeral 8 denotes a second interlayer dielectric, and the reference numeral 9 denotes a third interlayer dielectric.

The field-effect transistor of the present disclosure can be suitably used for field-effect transistors for pixel drive circuits and logic circuits such as liquid crystal displays, organic EL displays, and electrochromic displays.

(Method for Producing Field-Effect Transistor)

A method of the present disclosure for producing a field-effect transistor includes coating the coating liquid of the present disclosure for forming a metal oxide film to form a gate insulating layer (step of forming a gate insulating layer), and further includes other steps such as a step of forming a gate electrode, a step of forming a source electrode and a drain electrode, and a step of forming a semiconductor layer, if necessary.

<Step of Forming Gate Insulating Layer>

The step of forming a gate insulating layer is not particularly limited and may be appropriately selected depending on the intended purpose, so long as the step is a step of coating the coating liquid of the present disclosure for forming a metal oxide film to form a gate insulating layer. For example, the step includes coating the coating liquid of the present disclosure for forming a metal oxide film and drying the coating liquid, followed by baking.

By performing the step of forming a gate insulating layer, it is possible to obtain the gate insulating layer that is the oxide insulator film of the present disclosure.

A method of the coating is not particularly limited and may be appropriately selected depending on the intended purpose. Examples of the method include the screen printing method, the roll coating method, the dip-coating method, the spin coating method, the die coating method, the inkjet method, and the nanoimprint method. Among them, the spin coating method and the die coating method are preferable because these methods are easily used in combination with the existing photolithography techniques.

The drying is not particularly limited and may be appropriately selected depending on the intended purpose, so long as volatile components in the coating liquid for forming a metal oxide film can be removed. Note that, in the drying, it is not necessary to completely remove the volatile components, and the volatile components can be removed in such a degree that the volatile components do not inhibit the baking.

A temperature of the baking is not particularly limited and may be appropriately selected depending on the intended purpose, so long as the temperature is equal to or higher than a temperature at which the metal elements included in the coating liquid form oxides, and the temperature is equal to or lower than a temperature at which the object to be coated is deformed by heat. The temperature of the baking is preferably from 150 degrees Celsius through 600 degrees Celsius.

An atmosphere of the baking is not particularly limited and may be appropriately selected depending on the intended purpose. For example, an oxygen-including atmosphere (e.g., in oxygen and in the air) is preferable. The above atmospheres can oxidize and gasify organic matters and anions included in the metal sources or the solvents to be removed from the film. Moreover, when the coating liquid is baked in an atmosphere including nitrogen (e.g., in nitrogen and in an ammonia vapor), it is possible to incorporate nitrogen into the film to form the oxynitride film. As a result, the physical characteristics of the film such as relative dielectric constant and thermal expansion coefficient can be controlled.

Time for the baking is not particularly limited and may be appropriately selected depending on the intended purpose.

<Step of Forming Gate Electrode>

The step of forming a gate electrode is not particularly limited and may be appropriately selected depending on the intended purpose, so long as the step is a step of forming a gate electrode. Examples of the step include (i) a step of forming a gate electrode by forming a film through, for example, the sputtering method or the dip coating method and then patterning the film through photolithography; and (ii) a step of forming a gate electrode by directly forming a film having a desired pattern through the printing process, such as inkjet printing, nanoimprinting, or gravure printing.

<Step of Forming Source Electrode and Drain Electrode>

The step of forming a source electrode and a drain electrode is not particularly limited and may be appropriately selected depending on the intended purpose, so long as the step is a step of forming the source electrode and the drain electrode to be spaced from each other. Examples of the step include (i) a step of forming a source electrode and a drain electrode by forming a film through, for example, the sputtering method or the dip coating method and then patterning the film through photolithography; and (ii) a step of forming a source electrode and a drain electrode by directly forming a film having a desired pattern through the printing process, such as inkjet printing, nanoimprinting, or gravure printing.

<Step of Forming Semiconductor Layer>

In one example, the step of forming a semiconductor layer is not particularly limited and may be appropriately selected depending on the intended purpose, so long as the step is a step of forming a semiconductor layer. Examples of the step include (i) a step of forming a semiconductor layer by forming a film through, for example, the sputtering method or the dip coating method and then patterning the film through photolithography; and (ii) a step of forming a semiconductor layer by directly forming a film having a desired pattern through the printing process, such as inkjet printing, nanoimprinting, or gravure printing.

Here, a method for producing a bottom gate/bottom contact field-effect transistor will be described with reference to FIG. 6A to FIG. 6D.

First, on a substrate 1 formed of, for example, a glass substrate, a conductive film consisting of, for example, aluminum is formed through the sputtering method, and the conductive film formed is patterned through photolithography to form a gate electrode 2 (FIG. 6A).

Next, a gate insulating layer 3 is formed on the gate electrode 2 and the substrate 1 so as to cover the gate electrode 2 (FIG. 6B). The gate insulating layer 3 is the oxide insulator film of the present disclosure, and is obtained by, for example, coating the coating liquid of the present disclosure for forming a metal oxide film and drying the coating liquid, followed by baking.

Then, a conductive film consisting of, for example, ITO is formed on the gate insulating layer 3 through, for example, the sputtering method, and the conductive film formed is patterned through photolithography to form a source electrode 4 and a drain electrode 5 (FIG. 6C).

Then, an oxide semiconductor film is formed on the gate insulating layer 3 through the sputtering method so as to cover a channel region formed between the source electrode 4 and the drain electrode 5, and the oxide semiconductor film formed is patterned through photolithography to form a semiconductor layer 6 (FIG. 6D).

As described above, a field-effect transistor is produced.

(Display Element)

A display element of the present disclosure includes at least an optical control element and a driving circuit configured to drive the optical control element, and further includes other components if necessary.

The light control element is not particularly limited and may be appropriately selected depending on the intended purpose, so long as the light control element is an element configured to control light output according to a driving signal. Examples of the light control element include electroluminescent (EL) elements, electrochromic (EC) elements, liquid crystal elements, electrophoretic elements, and electrowetting elements.

The driving circuit is not particularly limited and may be appropriately selected depending on the intended purpose, so long as the driving circuit includes the field-effect transistor according to the embodiment. The other components are not particularly limited and may be appropriately selected depending on the intended purpose.

The display element according to another embodiment includes the field-effect transistor according to the embodiment. Therefore, the gate insulating layer 13 has a favorable insulation property, making it possible to obtain favorable electrical characteristics. As a result, display with high quality can be achieved.

(Image Display Device)

An image display device of the present disclosure includes at least a plurality of display elements according to another embodiment, a plurality of wired lines, and a display control device, and further includes other components if necessary.

The plurality of display elements are not particularly limited and may be appropriately selected depending on the intended purpose, so long as the plurality of display elements are a plurality of display elements arranged in a form of matrix according to another embodiment.

The plurality of wired lines are not particularly limited and may be appropriately selected depending on the intended purpose, so long as the plurality of wired lines can individually apply gate voltage and image data signal to the field-effect transistors in the plurality of display elements.

The display control device is not particularly limited and may be appropriately selected depending on the intended purpose, so long as the display control device can individually control the gate voltage and the signal voltage of the field-effect transistors via the plurality of wired lines correspondingly to the image data.

The other components are not particularly limited and may be appropriately selected depending on the intended purpose.

The image display device according to another embodiment includes a display element including the field-effect transistor according to the embodiment, thus an image with high quality can be displayed.

(System)

A system according of the present disclosure includes at least the image display device according to another embodiment and an image-data-generating device.

The image-data-generating device generates image data based on image information to be displayed and to output the image data to the image display device.

The system includes the image display device according to another embodiment, and thus image information can be displayed with high definition.

Hereinafter, the display element, the image display device, and the system according to another embodiment will be specifically described.

FIG. 7 presents a schematic configuration of a television device 500 as a system according to another embodiment. Note that, connection lines in FIG. 7 present flow of representative signal or information, and do not present all the connection relationships between blocks.

A television device 500 according to another embodiment includes, for example, a main control device 501, a tuner 503, an AD converter (ADC) 504, a demodulating circuit 505, a transport stream (TS) decoder 506, a sound decoder 511, a DA converter (DAC) 512, a sound output circuit 513, a speaker 514, an image decoder 521, an image•OSD synthesis circuit 522, an image output circuit 523, an image display device 524, an OSD drawing circuit 525, a memory 531, an operating device 532, a drive interface (drive IF) 541, a hard disk device 542, an optical disk device 543, an IR photodetector 551, and a communication control unit 552.

The main control device 501 is configured to control the entirety of the television device 500 and includes, for example, a CPU, a flash ROM, and a RAM. The flash ROM stores: for example, a program written with a code that can be decoded with the CPU; and various data used in processing with the CPU. Also, the RAM is a memory for operation.

The tuner 503 is configured to select a pre-set channel from the broadcast waves received by an antenna 610. The ADC 504 is configured to convert the output signal (analog information) of the tuner 503 into digital information. The demodulating circuit 505 is configured to demodulate the digital information from the ADC 504.

The TS decoder 506 is configured to TS decode the output signal of the demodulating circuit 505 to separate the output signal into sound information and image information. The sound decoder 511 is configured to decode the sound information from the TS decoder 506. The DA converter (DAC) 512 is configured to convert the output signal of the sound decoder 511 into an analog signal.

The sound output circuit 513 is configured to output the output signal of the DA converter (DAC) 512 to the speaker 514. The image decoder 521 is configured to decode the image information from the TS decoder 506. The image•OSD synthesis circuit 522 is configured to synthesize an output signal of the image decoder 521 and an output signal of the OSD drawing circuit 525.

The image output circuit 523 is configured to output the output signal of the image•OSD synthesis circuit 522 to the image display device 524. The OSD drawing circuit 525 includes a character generator configured to display characters or graphics on a screen of the image display device 524. The OSD drawing circuit 525 is configured to generate a signal including display information according to the instructions from the operating device 532 and the IR photodetector 551.

The memory 531 is configured to temporarily store audio-visual (AV) data. The operating device 532 includes an input medium (not illustrated) such as a control panel. The operating device 532 is configured to inform various information input by a user to the main control device 501. The drive IF 541 is an interactive communication interface. One example of the drive IF 541 is according to AT attachment packet interface (ATAPI).

The hard disk device 542 includes, for example, a hard disk and a driving device configured to drive the hard disk. The driving device is configured to record data on the hard disk and reproduce the data recorded on the hard disk. The optical disk device 543 is configured to record data on an optical disk (e.g., a DVD) and reproduce the data recorded on the optical disk.

The IR photodetector 551 is configured to receive a photosignal from a remote-controlled transmitter 620 and inform the received photosignal to the main control device 501. The communication control unit 552 is configured to control communication with the Internet. Various kinds of information can be obtained via the Internet.

As presented in FIG. 8 as one example, the image display device 524 includes a display unit 700 and a display control device 780. As presented in FIG. 9 as one example, the display unit 700 includes a display 710 in which a plurality of display elements 702 are arranged in a form of matrix (the number "n"×the number "m" herein).

As presented in FIG. 10 as one example, the display 710 includes "n" scanning lines (X0, X1, X2, X3, Xn−2, Xn−1) arranged along the X axis direction at constant intervals, "m" data lines (Y0, Y1, Y2, Y3, Ym−1) arranged along the Y axis direction at constant intervals, and "m" current supply lines (Y0$i$, Y1$i$, Y2$i$, Y3$i$, . . . Ym−1$i$) arranged along the Y axis direction at constant intervals. Each of the display elements 702 can be identified by each of the scanning lines and each of the data lines.

As presented in FIG. 11 as one example, each display element 702 includes an organic electroluminescent (EL) element 750 and a drive circuit 720 configured to allow the organic EL element 750 to emit light. Specifically, the display 710 is an organic EL display of a so-called active matrix system. The display 710 is a 32-inch color display. Note that, a size of the display is not limited to this size.

As presented in FIG. 12 as one example, the organic EL element 750 includes an organic EL thin film layer 740, a cathode 712, and an anode 714.

The organic EL element 750 can be arranged, for example, beside a field-effect transistor. In this case, the organic EL element 750 and the field-effect transistor can be formed on the same substrate. However, arrangement of the organic EL element 750 and the field-effect transistor is not limited to the above arrangement. For example, the organic EL element 750 may be disposed on the field-effect transistor. In this case, the gate electrode is required to have transparency. Therefore, a conductive transparent oxide (e.g., ITO (Indium Tin Oxide), $In_2O_3$, $SnO_2$, ZnO, Ga-doped ZnO, Al-doped ZnO, and Sb-doped $SnO_2$) is used for the gate electrode.

In the organic EL element 750, Al is used in the cathode 712. Note that, a Mg—Ag alloy, an Al—Li alloy, ITO, or the like may be used. ITO is used in the anode 714. An oxide having a conductivity such as $In_2O_3$, $SnO_2$, or ZnO and an Ag—Nd alloy may be used.

The organic EL thin film layer 740 includes an electron transporting layer 742, a light emitting layer 744, and a hole transporting layer 746. The electron transporting layer 742 is coupled to a cathode 712, and the hole transporting layer 746 is coupled to an anode 714. The light emitting layer 744 emits light when a predetermined voltage is applied between the anode 714 and the cathode 712.

As presented in FIG. 11, the drive circuit 720 includes two field-effect transistors 810 and 820 and a capacitor 830. The field-effect transistor 810 operates as a switching element. A gate electrode G is coupled to a predetermined scanning line and a source electrode S is coupled to a predetermined data line. Moreover, a drain electrode D is coupled to one terminal of the capacitor 830.

The capacitor 830 is configured to memorize the state of the field-effect transistor 810; i.e., data. The other terminal of the capacitor 830 is coupled to a predetermined current supply line.

The field-effect transistor 820 is configured to supply large electric current to the organic EL element 750. The gate electrode G of the field-effect transistor 820 is coupled to a drain electrode D of the field-effect transistor 810. The drain electrode D of the field-effect transistor 820 is coupled to an anode 714 of the organic EL element 750 and the source electrode S of the field-effect transistor 820 is coupled to a predetermined current supply line.

When the field-effect transistor 810 turns into the state of "on", the organic EL element 750 is driven by the field-effect transistor 820.

As presented in FIG. 13 as one example, the display control device 780 includes an image-data-processing circuit 782, a scanning-line-driving circuit 784, and a data-line-driving circuit 786.

The image-data-processing circuit 782 determines brightness of a plurality of display elements 702 in the display 710 based on output signals of the image output circuit 523. The scanning-line-driving circuit 784 individually applies voltage to "n" scanning lines according to the instructions of the image-data-processing circuit 782. The data-line-driving circuit 786 individually applies voltage to "m" data lines according to the instructions of the image-data-processing circuit 782.

As is clear from the above description, in a television device 500 according to an embodiment of the present disclosure, an image decoder 521, an image•OSD synthesis circuit 522, an image output circuit 523, and an OSD drawing circuit 525 constitute the image-data-generating device.

In the above, the case where the light control element is an organic EL element has been described. However, the light control element is not limited thereto, and may be a liquid crystal element, an electrochromic element, an electrophoretic element, an electrowetting element.

For example, when the light control element is a liquid crystal element, a liquid crystal display is used as the display 710. In this case, as presented in FIG. 14, it is not necessary to provide a current supply line for the display element 703.

In this case, as presented in FIG. 15 as one example, the drive circuit 730 can be constituted with one field-effect transistor 840, which is similar to each of the field-effect transistors (810 and 820) presented in FIG. 11. In the field-effect transistor 840, a gate electrode G is coupled to a predetermined scanning line and a source electrode S is coupled to a predetermined data line. Moreover, a drain electrode D is coupled to a pixel electrode of a liquid crystal element 770 and a capacitor 760. In FIG. 15, the reference numeral 762 denotes a counter electrode (common electrode) of the capacitor 760 and the reference numeral 772 denotes a counter electrode (common electrode) of the liquid crystal element 770.

In the above embodiment, the case where the system is a television device has been described. However, the system is not limited thereto. That is, the system is not particularly limited so long as it includes the image display device 524 as a device configured to display images and information. For example, the system may be a computer system in which a computer (including a personal computer) is coupled to the image display device 524.

The image display device 524 can be used as a display unit in mobile information devices (e.g., mobile phones, portable music players, portable video players, electronic books, and personal digital assistants (PDAs)) and camera devices (e.g., still cameras and video cameras). Moreover, the image display device 524 can be used as a display unit for various pieces of information in transportation systems (e.g., cars, aircraft, trains, and ships). Furthermore, the image display device 524 can be used as a display unit for various pieces of information in measuring devices, analysis devices, medical equipment, and advertising media.

As described above, preferable embodiments and the like have been described in detail. However, the present disclosure is not limited to the aforementioned embodiments, and various modifications and substitutions can be added to the aforementioned embodiments without departing from the scope described in the claims.

EXAMPLES

The present disclosure will next be described by way of Examples, but the present disclosure should not be construed as being limited to these Examples.

Example 1-1

<Preparation of Coating Liquid for Forming Oxide Insulator Film>

Zirconium oxynitrate dihydrate (0.50 mol) and magnesium nitrate hexahydrate (0.50 mol) were weighed. Then, ethylene glycol monomethyl ether (500 mL), propylene glycol (1800 mL), water (1200 mL), and isopropanol (1800 mL) were added and were dissolved to prepare a coating liquid for forming an oxide insulator film 1-1.

Examples 1-2 to 1-12

<Preparation of Coating Liquid for Forming Oxide Insulator Film>

Coating liquids for forming an oxide insulator film 1-2 to 1-12 of Examples 1-2 to 1-12 were prepared using material formulations presented in Tables 1-1 and 1-2 in the same manner as in Example 1-1.

Reference Examples 1-13 to 1-15

<Preparation of Coating Liquid for Forming Oxide Insulator Film>

Coating liquids for forming an oxide insulator film 1-13 to 1-15 of Reference Examples 1-13 to 1-15 were prepared using material formulations presented in Tables 2-1 and 2-2 in the same manner as in Example 1-1.

TABLE 1-1

| Example | Coating liquid No | Solute A Solute | Solute A Amount mol | Solute B Solute | Solute B Amount mol | Solute C Solute | Solute C Amount mol |
|---|---|---|---|---|---|---|---|
| 1-1 | 1-1 | ZrO(NO$_3$)$_2$•2H$_2$O | 0.50 | Mg(NO$_3$)$_2$•6H$_2$O | 0.50 | | |
| 1-2 | 1-2 | HfCl$_4$ | 0.60 | BeSO$_4$•4H$_2$O | 0.40 | | |
| 1-3 | 1-3 | ZrO(C$_8$H$_{15}$O$_2$)$_2$ | 0.62 | Be(acac)$_2$ | 0.22 | Gd(C$_8$H$_{15}$O$_2$)$_3$ | 0.04 |
| 1-4 | 1-4 | ZrCl$_4$•8H$_2$O | 0.30 | MgCl$_2$•6H$_2$O | 0.30 | LaCl$_3$•7H$_2$O | 0.30 |
| 1-5 | 1-5 | Hf(acac)$_4$ | 0.80 | Mg(C$_8$H$_{15}$O$_2$)$_2$ | 0.10 | Y(C$_8$H$_{15}$O$_2$)$_3$ | 0.10 |
| 1-6 | 1-6 | ZrO(NO$_3$)$_2$•2H$_2$O | 0.41 | Mg(NO$_3$)$_2$•6H$_2$O | 0.04 | La(NO$_3$)$_3$•6H$_2$O | 0.43 |
| 1-7 | 1-7 | ZrCl$_4$•8H$_2$O | 0.20 | Mg(NO$_3$)$_2$•6H$_2$O | 0.20 | Sc(NO$_3$)$_3$•6H$_2$O | 0.40 |
| 1-8 | 1-8 | Hf(C$_8$H$_{15}$O$_2$)$_4$ | 0.22 | Mg(C$_8$H$_{15}$O$_2$)$_2$ | 0.04 | Ce(C$_8$H$_{15}$O$_2$)$_3$ | 0.62 |
| 1-9 | 1-9 | HfCl$_4$ | 0.20 | Mg(NO$_3$)$_2$•6H$_2$O | 0.80 | | |
| 1-10 | 1-10 | ZrO(C$_8$H$_{15}$O$_2$)$_2$ | 0.80 | Be(acac)$_2$ | 0.20 | | |
| 1-11 | 1-11 | ZrCl$_4$•8H$_2$O | 0.20 | Mg(NO$_3$)$_2$•6H$_2$O | 0.50 | PrCl$_3$•7H$_2$O | 0.30 |
| 1-12 | 1-12 | ZrO(NO$_3$)$_2$•2H$_2$O | 0.20 | Mg(NO$_3$)$_2$•6H$_2$O | 0.50 | LuCl$_3$•7H$_2$O | 0.30 |

TABLE 1-2

| Example | Coating liquid No | Solvent D Compound | mL | Solvent E Compound | mL | Solvent F Compound | mL | Solvent G Compound | mL |
|---|---|---|---|---|---|---|---|---|---|
| 1-1 | 1-1 | EGME | 500 | PG | 1800 | $H_2O$ | 1200 | IPA | 1800 |
| 1-2 | 1-2 | EGME | 500 | EG | 1800 | $H_2O$ | 1200 | MeOH | 1800 |
| 1-3 | 1-3 | Toluene | 2500 | CHB | 2500 | | | | |
| 1-4 | 1-4 | EGIPE | 500 | PG | 2000 | $H_2O$ | 1000 | EtOH | 1500 |
| 1-5 | 1-5 | Xylene | 2500 | CHB | 2500 | | | | |
| 1-6 | 1-6 | EGIPE | 500 | EG | 1800 | $H_2O$ | 1200 | IPA | 1500 |
| 1-7 | 1-7 | EGIPE | 500 | EG | 1800 | $H_2O$ | 1200 | IPA | 1500 |
| 1-8 | 1-8 | Xylene | 2500 | CHB | 2500 | | | | |
| 1-9 | 1-9 | EGME | 500 | EG | 1800 | $H_2O$ | 1200 | MeOH | 1800 |
| 1-10 | 1-10 | Toluene | 2500 | CHB | 2500 | | | | |
| 1-11 | 1-11 | EGME | 500 | PG | 2000 | $H_2O$ | 1000 | EtOH | 1500 |
| 1-12 | 1-12 | EGME | 500 | PG | 2000 | $H_2O$ | 1000 | EtOH | 1500 |

TABLE 2-1

| Reference Example | Coating liquid No | Solute A Solute | Amount mol | Solute B Solute | Amount mol | Solute C Solute | Amount mol |
|---|---|---|---|---|---|---|---|
| 1-13 | 1-13 | $ZrCl_4 \cdot 8H_2O$ | 0.42 | $CaCl_2 \cdot 2H_2O$ | 0.04 | $LaCl_3 \cdot 7H_2O$ | 0.42 |
| 1-14 | 1-14 | $HfCl_4$ | 0.65 | $BaCl_2 \cdot 2H_2O$ | 0.05 | $LaCl_3 \cdot 7H_2O$ | 0.30 |
| 1-15 | 1-15 | $ZrCl_4 \cdot 8H_2O$ | 0.12 | $SrCl_2$ | 0.04 | $LaCl_3 \cdot 7H_2O$ | 0.72 |

TABLE 2-2

| Reference Example | Coating liquid No | Solvent D Compound | mL | Solvent E Compound | mL | Solvent F Compound | mL | Solvent G Compound | mL |
|---|---|---|---|---|---|---|---|---|---|
| 1-13 | 1-13 | EGIPE | 500 | PG | 2000 | $H_2O$ | 1000 | EtOH | 1500 |
| 1-14 | 1-14 | EGIPE | 500 | PG | 2000 | $H_2O$ | 1000 | EtOH | 1500 |
| 1-15 | 1-15 | EGIPE | 500 | PG | 2000 | $H_2O$ | 1000 | EtOH | 1500 |

In Table 1-1, Table 1-2, Table 2-1, and Table 2-2, names of materials and solvents are as follows.

<Solute A>
$ZrO(NO_3)_2 \cdot 2H_2O$: Zirconium oxynitrate dihydrate
$HfCl_4$: Hafnium chloride
$ZrO(C_8H_{15}O_2)_2$: Zirconium bis(2-ethylhexanoate) oxide
$ZrCl_4 \cdot 8H_2O$: Zirconium chloride octahydrate
$Hf(acac)_4$: Hafnium acetylacetonate
$Hf(C_8H_{15}O_2)_4$: Hafnium tetra(2-ethylhexanoate)
<Solute B>
$Mg(NO_3)_2 \cdot 6H_2O$: Magnesium nitrate hexahydrate
$BeSO_4 \cdot 4H_2O$: Beryllium nitrate tetrahydrate
$Be(acac)_2$: Beryllium acetylacetonate
$MgCl_2 \cdot 6H_2O$: Magnesium chloride hexahydrate
$Mg(C_8H_{15}O_2)_2$: Magnesium bis(2-ethylhexanoate)
$CaCl_2 \cdot 2H_2O$: Calcium chloride dihydrate
$BaCl_2 \cdot 2H_2O$: Barium chloride dihydrate
$SrCl_2$: Strontium chloride
<Solute C>
$Gd(C_8H_{15}O_2)_3$: Gadolinium tris(2-ethylhexanoate)
$LaCl_3 \cdot 7H_2O$: Lanthanum chloride heptahydrate
$Y(C_8H_{15}O_2)_3$: Yttrium tris(2-ethylhexanoate)
$La(NO_3)_3 \cdot 6H_2O$: Lanthanum nitrate hexahydrate
$Sc(NO_3)_3 \cdot 6H_2O$: Scandium nitrate hexahydrate
$Ce(C_8H_{15}O_2)_3$: Cerium tris(2-ethylhexanoate)
$PrCl_3 \cdot 7H_2O$: Praseodymium nitrate heptahydrate
$LuCl_3 \cdot 7H_2O$: Lutetium nitrate heptahydrate
<Solvent D>
EGME: Ethylene glycol monomethyl ether
EGIPE: Ethylene glycol monoisopropyl ether
<Solvent E>
PG: Propylene glycol
EG: Ethylene glycol
CHB: Cyclohexylbenzene
<Solvent F>
$H_2O$: Water
<Solvent G>
IPA: Isopropanol
EtOH: Ethanol
MeOH: Methanol Example 2-1

Using a spin coater, the coating liquid 1-1 in Table 1-1 and Table 1-2 was printed on an alkali-free glass substrate that had been subjected to UV ozone cleaning. The printing property was good. The substrate was dried for 10 minutes on a hot plate, which had been heated to 120 degrees Celsius and was baked at 400 degrees Celsius for 1 hour in an air atmosphere to obtain a transparent oxide film.

Examples 2-2 to 2-12

In the same manner as in Example 2-1, each of the coating liquids 1-2 to 1-12 in Tables 1-1 and 1-2 was subjected to printing/drying/baking to obtain a similar transparent oxide film. All of the coating liquids had good printing properties similar to the coating liquid in Example 2-1.

The correspondence relationship between the coating liquids 1-2 to 1-12 and Examples 2-2 to 2-12 is as follows.
Example 2-2: Coating Liquid 1-2
Example 2-3: Coating Liquid 1-3
Example 2-4: Coating Liquid 1-4
Example 2-5: Coating Liquid 1-5
Example 2-6: Coating Liquid 1-6
Example 2-7: Coating Liquid 1-7
Example 2-8: Coating Liquid 1-8
Example 2-9: Coating Liquid 1-9
Example 2-10: Coating Liquid 1-10
Example 2-11: Coating Liquid 1-11
Example 2-12: Coating Liquid 1-12

Reference Examples 2-13 to 2-15

In the same manner as in Example 2-1, each of the coating liquids 1-13 to 1-15 in Tables 2-1 and 2-2 was subjected to printing/drying/baking to obtain a similar transparent oxide film. All of the coating liquids had good printing properties similar to the coating liquid in Example 2-1.

The correspondence relationship between the coating liquids 1-13 to 1-15 and Reference Examples 2-13 to 2-15 is as follows.
Reference Example 2-13: Coating Liquid 1-13
Reference Example 2-14: Coating Liquid 1-14
Reference Example 2-15: Coating Liquid 1-15

Example 3-1

On an alkali-free glass substrate that had been subjected to UV ozone cleaning, 100 nm of Al as a bottom electrode was deposited through a mask. The coating liquid 1-1 in Table 1-1 and Table 1-2 was printed thereon through the spin coating. The film formation property was good. The substrate was dried at 120 degrees Celsius for 1 hour in an air atmosphere in an oven and was baked at 400 degrees Celsius for 1 hour in an air atmosphere to obtain an oxide insulator film. Subsequently, 100 nm of Al as an upper electrode was deposited through a mask to form a capacitor structure.

It was confirmed that the capacitor produced in the present Example had a relative dielectric constant E of 10.4 or more in a region of from 100 Hz through 1 MHz and had a high relative dielectric constant. In addition, it was confirmed that the value of dielectric loss tan δ was a low value of about 2% or less at from 100 Hz through 100 kHz.

Example 4-1

<Preparation of Field-Effect Transistor>
—Formation of Active Layer—
An alkali-free glass substrate was subjected to the ultrasonic cleansing with a neutral detergent, pure water, and isopropyl alcohol. The substrate was dried and was subjected to an UV-ozone treatment at 90 degrees Celsius for 10 minutes. On the alkali-free glass substrate, the coating liquid for forming an n-type oxide semiconductor film prepared in the following manner was coated by a spin coater. The resultant was dried at 120 degrees Celsius for 1 hour in an air atmosphere in an oven and was baked at 400 degrees Celsius for 1 hour in an air atmosphere to obtain an n-type oxide semiconductor film. Then, an active layer having a predetermined shape was obtained through photolithography.

—Coating Liquid for Forming n-Type Oxide Semiconductor Film—
Magnesium chloride hexahydrate [$Mg(NO_3)_2 \cdot 6H_2O$] (0.3 mol), indium nitrate trihydrate [$In(NO_3)_3 \cdot 3H_2O$] (0.6 mol), and tin chloride pentahydrate [$SnCl_4 \cdot 5H_2O$] (0.01 mol) were weighed. Then, N-methylpyrrolidone [NMP] (1500 mL), propylene glycol (1500 mL), water (1000 mL), and methanol (2000 mL) were added thereto and were dissolved to prepare a coating liquid for forming an n-type oxide semiconductor film.

—Formation of Source Electrode and Drain Electrode—
Next, a film of an aluminum alloy (100 nm) was formed thereon through the DC magnetron sputtering method and was patterned through photolithography to form a source electrode and a drain electrode. Here, a channel width defined by length of the source and drain electrodes was set to 30 micrometers and a channel length defined by a spacing between the source electrode and the drain electrode was set to 10 micrometers.

—Formation of Gate Insulating Layer—
Then, the coating liquid 1-1 was coated by a spin coater. The substrate was dried for 10 minutes on a hot plate that had been heated to 120 degrees Celsius and was baked at 400 degrees Celsius for one hour in an air atmosphere to obtain a gate insulating layer. An average thickness of the gate insulating layer obtained was about 130 nm.

—Formation of Gate Electrode—
A film of Mo (100 nm) was formed through the DC magnetron sputtering method and was patterned through photolithography to form a gate electrode.

—Formation of Electrode Pads—
Next, through holes were patterned in the gate insulating layer through the photolithography method to form electrode pads of the source electrode and the drain electrode.

Finally, annealing was performed at 250 degrees Celsius for one hour in an air atmosphere.

As described above, a field-effect transistor was produced.

Examples 4-2 to 4-12

A field-effect transistor was produced in the same manner as in Example 4-1 except that the coating liquid 1-1 was changed to each of the coating liquids described below.
Example 4-2: Coating Liquid 1-2
Example 4-3: Coating Liquid 1-3
Example 4-4: Coating Liquid 1-4
Example 4-5: Coating Liquid 1-5
Example 4-6: Coating Liquid 1-6
Example 4-7: Coating Liquid 1-7
Example 4-8: Coating Liquid 1-8
Example 4-9: Coating Liquid 1-9
Example 4-10: Coating Liquid 1-10
Example 4-11: Coating Liquid 1-11
Example 4-12: Coating Liquid 1-12

Reference Examples 4-13 to 4-15

A field-effect transistor was produced in the same manner as in Example 4-1 except that the coating liquid 1-1 was changed to each of the following coating liquids.
Reference Example 4-13: Coating Liquid 1-13
Reference Example 4-14: Coating Liquid 1-14
Reference Example 4-15: Coating Liquid 1-15

Aspects of the present disclosure are as follows, for example.
<1> A field-effect transistor including:
a source electrode and a drain electrode;
a gate electrode;
a semiconductor layer; and
a gate insulating layer,
wherein the gate insulating layer is an oxide insulator film including A element and B element, the A element being one or more selected from the group consisting of Zr and Hf and the B element being one or more selected from the group consisting of Be and Mg.
<2> The field-effect transistor according to <1>,
wherein the semiconductor layer is an oxide semiconductor.
<3> The field-effect transistor according to <1> or <2>,
wherein the oxide insulator film further includes C element that is one or more selected from the group consisting of Sc, Y, and Ln (lanthanoid).
<4> The field-effect transistor according to any one of <1> to <3>, wherein an electron configuration of d orbital of a metal ion included in the oxide insulator film is $d^0$ or $d^{10}$.
<5> An oxide insulator film including:
A element that is one or more selected from the group consisting of Zr and Hf; and
B element that is one or more selected from the group consisting of Be and Mg.
<6> The oxide insulator film according to <5>, further including
C element that is one or more selected from the group consisting of Sc, Y, and Ln (lanthanoid).
<7> A coating liquid for forming a metal oxide film, the coating liquid including:
A element that is one or more selected from the group consisting of Zr and Hf; and
B element that is one or more selected from the group consisting of Be and Mg.
<8> The coating liquid for forming a metal oxide film according to <7>, further including
C element that is one or more selected from the group consisting of Sc, Y, and Ln (lanthanoid).
<9> The coating liquid for forming a metal oxide film according to <7> or <8>, further including
a solvent.
<10> A display element including:
an optical control element configured to control light output according to a driving signal; and
a driving circuit that includes the field-effect transistor according to any one of <1> to <4> and is configured to drive the optical control element.
<11> The display element according to <10>,
wherein the optical control element includes an electroluminescent element, an electrochromic element, a liquid crystal element, an electrophoretic element, or an electrowetting element.
<12> An image display device configured to display an image corresponding to image data, the image display device including:
a plurality of display elements arranged in a form of matrix, each of the plurality of display elements being the display element according to <10> or <11>;
a plurality of wired lines configured to individually apply gate voltage to field-effect transistors in the plurality of display elements; and
a display control device configured to individually control the gate voltage of the field-effect transistors via the plurality of wired lines correspondingly to the image data.
<13> A system including:
the image display device according to <12>; and
an image-data-generating device configured to generate image data based on image information to be displayed and to output the image data to the image display device.
<14> A method for producing an oxide insulator film, the method including:
coating the coating liquid for forming a metal oxide film according to any one of <7> to <9> on an object to be coated, and drying the coating liquid, followed by baking.
<15> A method for producing a field-effect transistor including a source electrode and a drain electrode, a gate electrode, a semiconductor layer, and a gate insulating layer, the method including:
coating the coating liquid for forming a metal oxide film according to any one of <7> to <9> to form the gate insulating layer.

REFERENCE SIGNS LIST

1 Substrate
2 Gate electrode
3 Gate insulating layer
4 Source electrode
5 Drain electrode
6 Semiconductor layer
7 First interlayer dielectric
8 Second interlayer dielectric
9 Third interlayer dielectric

The invention claimed is:
1. A field-effect transistor comprising:
a source electrode and a drain electrode;
a gate electrode;
a semiconductor layer; and
a gate insulating layer,
wherein the gate insulating layer is an oxide insulator film including A element and B element, the A element being one or more selected from the group consisting of Zr and Hf and the B element being one or more selected from the group consisting of Be and Mg, and
wherein the oxide insulator film is an oxide insulator film of a (Be, Mg)O—(Zr, Hf)O$_2$-system, where the oxide insulator film is free from a perovskite phase and a layered perovskite phase.
2. The field-effect transistor according to claim 1,
wherein the semiconductor layer is an oxide semiconductor.
3. The field-effect transistor according to claim 1,
wherein the oxide insulator film further includes C element that is one or more selected from the group consisting of Sc, Y, and Ln (lanthanoid).
4. The field-effect transistor according to claim 1,
wherein an electron configuration of d orbital of a metal ion included in the oxide insulator film is $d^0$ or $d^{10}$.
5. A display element comprising:
an optical control element configured to control light output according to a driving signal; and
a driving circuit that includes the field-effect transistor according to claim 1 and is configured to drive the optical control element.

6. The display element according to claim 5,
wherein the optical control element includes an electroluminescent element, an electrochromic element, a liquid crystal element, an electrophoretic element, or an electrowetting element.

7. An image display device configured to display an image corresponding to image data, the image display device comprising:
- a plurality of display elements arranged in a form of matrix, each of the plurality of display elements being the display element according to claim 5;
- a plurality of wired lines configured to individually apply gate voltage to field-effect transistors in the plurality of display elements; and
- a display control device configured to individually control the gate voltage of the field-effect transistors via the plurality of wired lines correspondingly to the image data.

8. A system comprising:
- the image display device according to claim 7; and
- an image-data-generating device configured to generate image data based on image information to be displayed and to output the image data to the image display device.

9. An oxide insulator film comprising:
- A element that is one or more selected from the group consisting of Zr and Hf; and
- B element that is one or more selected from the group consisting of Be and Mg, and
- wherein the oxide insulator film is an oxide insulator film of a (Be, Mg)O—(Zr, Hf)$O_2$-system, where the oxide insulator film is free from a perovskite phase and a layered perovskite phase.

10. The oxide insulator film according to claim 9, further comprising
- C element that is one or more selected from the group consisting of Sc, Y, and Ln (lanthanoid).

11. A coating liquid for forming a metal oxide film, the coating liquid comprising:
- A element that is one or more selected from the group consisting of Zr and Hf; and
- B element that is one or more selected from the group consisting of Be and Mg, and
- wherein the oxide insulator film is an oxide insulator film of a (Be, Mg)O—(Zr, Hf)$O_2$-system, where the oxide insulator film is free from a perovskite phase and a layered perovskite phase.

12. The coating liquid for forming a metal oxide film according to claim 11, further comprising
- C element that is one or more selected from the group consisting of Sc, Y, and Ln (lanthanoid).

13. The coating liquid for forming a metal oxide film according to claim 11, further comprising
- a solvent.

14. A method for producing an oxide insulator film, the method comprising:
- coating the coating liquid for forming a metal oxide film according to claim 11 on an object to be coated, and drying the coating liquid, followed by baking.

15. A method for producing a field-effect transistor including a source electrode and a drain electrode, a gate electrode, a semiconductor layer, and a gate insulating layer, the method comprising:
- coating the coating liquid for forming a metal oxide film according to claim 11 to form the gate insulating layer.

* * * * *